(12) United States Patent
Gardner et al.

(10) Patent No.: US 11,876,125 B2
(45) Date of Patent: Jan. 16, 2024

(54) METHOD OF MAKING A PLURALITY OF HIGH DENSITY LOGIC ELEMENTS WITH ADVANCED CMOS DEVICE LAYOUT

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 158 days.

(21) Appl. No.: 17/316,019

(22) Filed: May 10, 2021

(65) Prior Publication Data

US 2022/0102533 A1 Mar. 31, 2022

Related U.S. Application Data

(60) Provisional application No. 63/085,627, filed on Sep. 30, 2020.

(51) Int. Cl.
*H01L 29/66* (2006.01)
*H01L 29/40* (2006.01)
(Continued)

(52) U.S. Cl.
CPC ............ *H01L 29/66568* (2013.01); *H01L 21/823814* (2013.01); *H01L 21/823842* (2013.01); *H01L 21/823878* (2013.01); *H01L 21/823885* (2013.01); *H01L 21/823892* (2013.01); *H01L 27/088* (2013.01); *H01L 27/092* (2013.01);
(Continued)

(58) Field of Classification Search
CPC ..... H01L 21/823885; H01L 21/823814; H01L 21/823842; H01L 21/823878; H01L 21/823892; H01L 21/823475; H01L 29/66568; H01L 29/665; H01L 29/66666; H01L 29/7827; H01L 27/088; H01L 27/092; H01L 27/0925
See application file for complete search history.

(56) References Cited

U.S. PATENT DOCUMENTS 5,612,563 A * 3/1997 Fitch ................. H01L 21/76897
257/E29.267
6,882,006 B2 * 4/2005 Maeda ............... H01L 29/66666
257/329

(Continued)

*Primary Examiner* — Michael M Trinh

(57) ABSTRACT

Aspects of the present disclosure provide a 3D semiconductor apparatus and a method for fabricating the same. The 3D semiconductor apparatus can include a first semiconductor device including sidewall structures of a first gate metal sandwiched by dielectric layers, a first epitaxially grown channel surrounded by the sidewall structures; a second semiconductor device formed on the same substrate adjacent to the first semiconductor device that includes sidewall structures of a second gate metal sandwiched by dielectric layers, a second epitaxially grown channel surrounded by the sidewall structures; a salicide layer formed between the first and second semiconductor devices and metallization contacting each of the S/D regions and the gate regions. The 3D semiconductor apparatus may include a P+ epitaxially grown channel formed on the same substrate adjacent to an N+ epitaxially grown channel, the P+ epitaxially grown channel separated from N+ epitaxially grown channel by a diffusion break.

12 Claims, 14 Drawing Sheets

(51) Int. Cl.
*H01L 21/8238* (2006.01)
*H01L 27/088* (2006.01)
*H01L 27/092* (2006.01)

(52) U.S. Cl.
CPC ........ H01L 27/0925 (2013.01); H01L 29/401 (2013.01); H01L 29/665 (2013.01)

(56) References Cited

U.S. PATENT DOCUMENTS

| | | | | |
|---|---|---|---|---|
| 7,902,026 B2* | 3/2011 | Chung | ............. | H01L 29/66545 438/270 |
| 2011/0012085 A1* | 1/2011 | Deligianni | ........ | H01L 29/78642 257/E21.409 |
| 2011/0108803 A1* | 5/2011 | Deligianni | ........ | H01L 29/78642 977/762 |
| 2013/0341702 A1* | 12/2013 | Kar | .................... | H01L 29/7926 257/324 |

* cited by examiner

METHOD OF MAKING A PLURALITY OF HIGH DENSITY LOGIC ELEMENTS WITH ADVANCED CMOS DEVICE LAYOUT

CROSS REFERENCE TO RELATED APPLICATIONS

The present application claims the benefit of U.S. Prov. Ser. No. 63/085,627 entitled "Method For Pattern Reduction Using A Staircase Spacer", filed on Sep. 30, 2020, incorporated herein by reference in its entirety.

BACKGROUND

Field of the Invention

This disclosure relates to microelectronic devices including semiconductor devices, transistors, and integrated circuits, including methods of microfabrication.

Description of the Related Art

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

In the manufacture of a semiconductor device, for example, especially on the microscopic scale, various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which multiple types of transistors can be formed on a common substrate.

SUMMARY 3D integration, i.e. the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array, SoC (System on a chip)) is being pursued.

Aspects of the present disclosure include vertical channel transistor devices and methods of manufacture include beginning with a layer stack of a metal layer between dielectric layers.

A stack of dielectric/metal/dielectric is used to make precision gate electrodes that can be scaled to small channel lengths and is self-aligned to the channel. Aspects of the present disclosure enable efficient formation of aligned 3D metal stacks and routing. A multiple threshold voltage, $V_t$, stack is enabled herein because metal is deposited so each transistor can have an optimum work function. Advanced 3D CMOS metals can withstand high temperatures and may be used prior to epitaxial growth. Gate electrode metal is self-aligned to the channel regions at any distance above the silicon substrate. The process flow can be used for any type of transistor geometry. Embodiments herein are compatible with all transistor types with unique gate electrode formation. More efficient metal gate electrode processing with greater precision is enabled by techniques herein.

In a first embodiment, a method of microfabrication is describe, the method comprising forming a layer stack on a substrate, the layer stack having a metal layer of a first metal positioned between a first dielectric layer and a second dielectric layer and a first capping layer on the second dielectric layer; forming openings through the layer stack until uncovering the underlying substrate material; epitaxially growing vertical channel structures in the openings for channels of transistors having current flow perpendicular to a working surface of the substrate; and masking the substrate and etching the layer stack leaving sidewall structures of the layer stack on the vertical channel structures, sidewall structures of the first metal forming a gate contact of a field effect transistor.

In a second embodiment, a semiconductor apparatus is described, comprising a substrate having first implanted regions of P+ or N+ dopants; a layer stack on the substrate, the layer stack having a metal layer of a first metal positioned between a first dielectric layer and a second dielectric layer; a plurality of vertical channels in the layer stack, each vertical channel located over one of the implanted regions, wherein sides of the vertical channels are covered by a high-K material; a P+ epitaxial material or an N+ epitaxial material filling each vertical channel over the P+ or N+ dopants respectively; sidewall structures surrounding each vertical channel; a first layer of salicide covering the substrate between the sidewall structures; a second layer of salicide covering each vertical channel; metal wiring connected to the first metal, the first layer of salicide and the second layer of salicide, the metal wiring formed within via channels of a dielectric film covering the substrate.

In a third embodiment, a semiconductor apparatus is described, comprising a substrate having first implanted regions of P+ dopants alternating with second implanted regions of N+ dopants; a diffusion break located in the substrate between the regions of P+ dopants and the regions N+ dopants; a layer stack on the substrate, the layer stack having a metal layer of a first metal positioned between a first dielectric layer and a second dielectric layer; P+ epitaxially grown vertical channels in the layer stack located over the P+ dopants; N+ epitaxially grown vertical channels in the layer stack located over the N+ dopants; a high-K material on sidewalls of each vertical channel; sidewall structures surrounding each vertical channel, wherein the sidewall structure surrounding a P+ vertical channel includes the first metal and the sidewall structure surrounding an N+ vertical channel has the first metal replaced by a second metal; a first layer of salicide covering the substrate between the sidewall structures; a second layer of salicide covering each vertical channel; and metal wiring connected to the first metal, the first layer of salicide and the second layer of salicide, the metal wiring formed within via channels of a dielectric film covering the substrate.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION

Figure 1A:
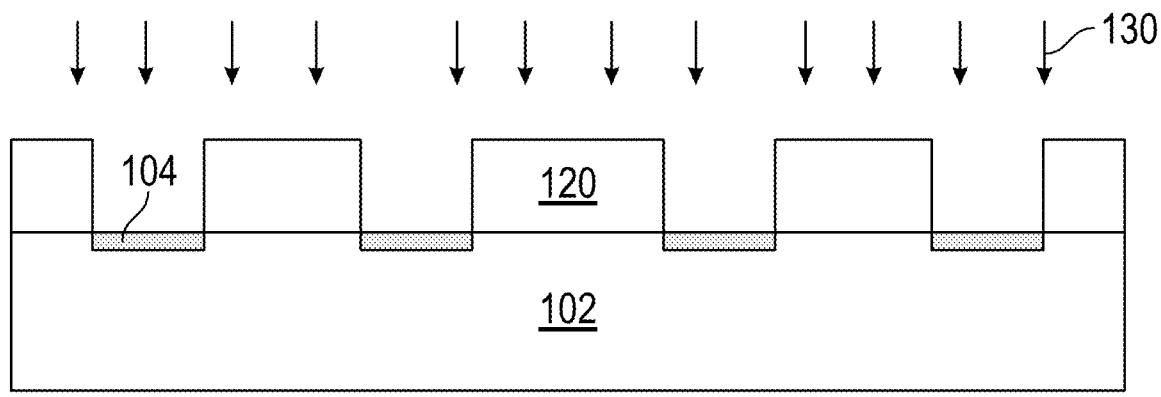
FIG. 1A illustrates N+ doping of a substrate between openings formed by masking, according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "top," "bottom," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Aspects of the present disclosure can enable 3D stacks of PMOS devices and NMOS devices or vice versa, formed on the same substrate by stepwise processing steps. 360 degree access to transistors can be provided for optimal routing for the gate electrode and source/drain (S/D) regions. Techniques can include a self-aligned 3D 360 degree implant or salicidation region. Aspects of the present disclosure can provide a reduction in layout because an entire vertical gate-all-around (GAA) inverter can be formed in each vertical stack. Methods herein can be used for any channel material in which two CMOS 3D transistors or devices have an N+ region connected to a P+ regions through a common region. Because 3D channel and 3D S/D regions are grown vertically, significant device scaling can be achieved with embodiments herein.

Aspects of the present disclosure include 3D vertical channel PMOS and NMOS transistor devices and methods of manufacture include beginning with a layer stack of a metal layer between dielectric layers. A stack of dielectric/metal/dielectric is used to make a precision gate electrode that can be scaled to small channel lengths and is self-aligned to the channel. Aspects of the present disclosure enable efficient formation of aligned 3D metal stacks and routing. A multiple threshold voltage, $V_t$, stack is enabled herein because metal is deposited so each transistor can have an optimum work function. Advanced 3D CMOS metals can withstand high temperatures and may be used prior to epitaxial growth. Example metals include ruthenium, Ru, tantalum nitride, TaN, titanium nitride, TiN, and tungsten, W, titanium carbide, TiC, gallium, Ga, gadolinium, Gd, titanium oxy nitride, TiON, tantalum silicon nitride, TaSiN, titanium silicon nitride, TiSiN, molybdenum, Mo, tungsten nitride, WN, aluminum, Al, copper, Cu, and combinations.

Each gate electrode metal is self-aligned to the channel regions at any distance above the silicon substrate. The process flows can be used for any type of transistor geometry. Embodiments herein are compatible with all transistor types with unique gate electrode formation. More efficient metal gate electrode processing with greater precision is enabled by techniques herein. Several process flows are described below covering CMOS transistors for advanced circuit designs.

Aspects of the present disclosure build logic devices vertically to improve the area reduction for CMOS Device operation and circuit options. This invention will provide the basic unit cell for 3D Vertical Devices. Aspects of the present disclosure may be extended to stack devices to make various circuit elements and circuits.

The advantages of the 3D vertical logic devices of the present disclosure are: improved control of short channel transistor effects; 3D upright transistor architecture that enables each device to be used with a unified device either as NMOS or PMOS device with options for logic configurations; compatibility with existing logic circuit layouts further increasing circuit layout and packing density; advanced 3D CMOS metals can withstand high temperatures and may be utilized prior to epitaxial growth (some examples Ru, TaN, TiN, W, and the like); more efficient metal gate electrode processing with more precision; and gate electrode metal is self-aligned to the channel regions at any distance above the silicon substrate.

The 3D vertical devices of the present disclosure have a process flow that can be used for multiple types of transistor geometries. Additionally, multiple threshold voltage, $V_t$, stacks may be manufactured on a single substrate, since metal is deposited so that each transistor can have an optimum work function.

In the present disclosure, four different process flows are presented of a 3D vertical basic unit cell. Each basic unit cell has a low subthreshold slope and a robust off state leakage current.

The vertical 3D devices of the present disclosure may be integrated with other device architectures.

In aspects of the present disclosure, each vertical 3D device is described as being one device tall, but may be extended to a stack of N devices.

Each vertical 3D device of the present disclosure has a gate stack of dielectric/metal/dielectric which forms a precision gate electrode that can be scaled to small channel lengths and which is self-aligned to the channel.

In aspects of the present disclosure, the structure of the 3D vertical stack allows for efficient formation of aligned 3D metal stacks and routing.

FIGS. 1A-1K, Flow A, illustrates a 3D metal/oxide stack used to make a self-aligned metal gate electrode with work function suitable for NMOS devices.

FIGS. 2A-2F, Flow B, illustrate a 3D metal/oxide stack used to make a self-aligned metal gate electrode with work function suitable for PMOS devices.

FIGS. 3A-3M, Flow C, illustrate an example of CMOS flow using dual metal work function stacks using a 3D metal/oxide stack to enable self-aligned metal gate electrode with dual work function suitable for CMOS devices using a silicon/oxide/silicon substrate with a diffusion break.

FIGS. 4A-4G, Flow D, illustrate an example of CMOS flow using dual metal work function stacks using a 3D metal/oxide stack to enable self-aligned metal gate electrode with dual work function suitable for CMOS devices using a silicon substrate with a diffusion break.

Embodiments of the present disclosure include both methods and devices. As can be appreciated, devices of different geometries and functions are contemplated.

FIGS. 1A-1K, Flow A, illustrate a 3D metal/oxide stack used to make a self-aligned metal gate electrode with work function suitable for NMOS devices.

In FIG. 1A, the processing flow starts with a substrate 102 of silicon/oxide/silicon. A photomask of photoresist 120 can be formed to define areas for N+ implantation doping (phosphorous, arsenic, or other N-type dopants) or plasma doping to form N+ layer 104.

Figure 1B:
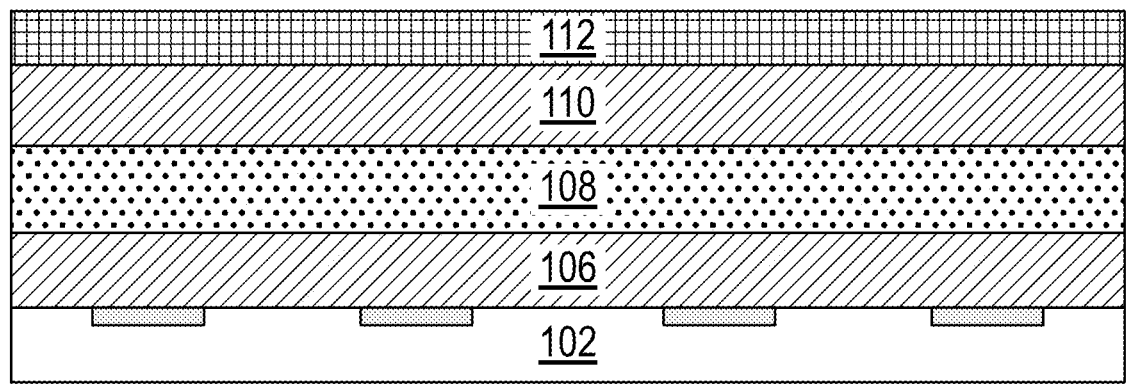
FIG. 1B illustrates a layer stack formed on the substrate, according to aspects of the present disclosure.

In FIG. 1B, the doping mask is removed, then a layer stack is deposited on the substrate. This layer stack includes a dielectric layer 106, a Metal 1 layer 108 deposited on dielectric layer 106, and a dielectric layer 110 deposited on the Metal 1 layer 108. Dielectric layer 106 may be the same dielectric material or a different dielectric material from layer 110. A capping layer 112 is deposited as the top layer. The Metal 1 region will become a future gate electrode of the NMOS device. In a non-limiting example, dielectric layer 106 may be oxide and Metal 1 may be selected from the group comprising ruthenium, Ru, tantalum nitride, TaN, titanium nitride, TiN, and tungsten, W, titanium carbide, TiC, gallium, Ga, gadolinium, Gd, titanium oxy nitride, TiON, tantalum silicon nitride, TaSiN, titanium silicon nitride, TiSiN, molybdenum, Mo, tungsten nitride, WN, aluminum, Al, copper, Cu, and combinations. In a non-limiting example, the capping layer 112 is titanium nitride, TiN.

Figure 1C:
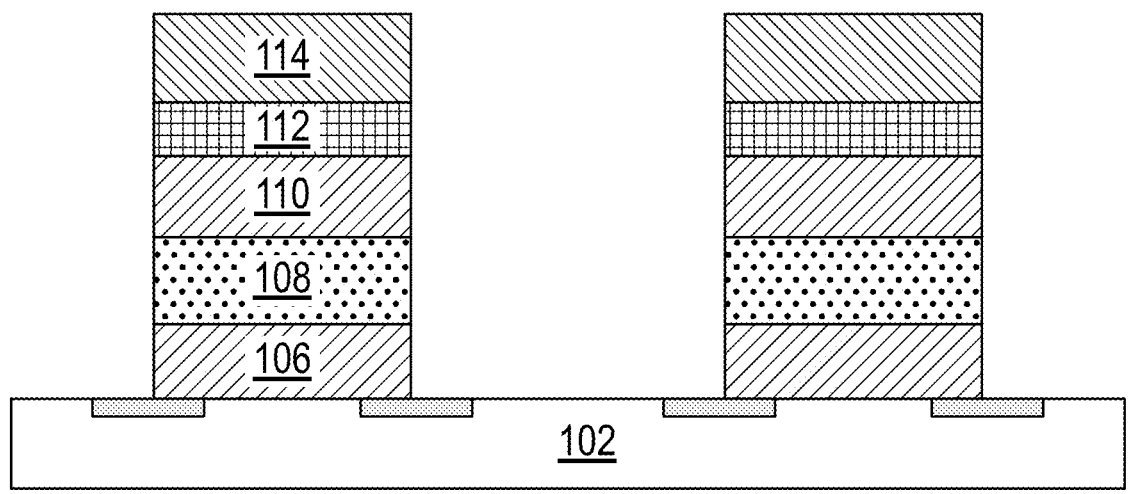
FIG. 1C illustrates the formation of openings in the layer stack, according to aspects of the present disclosure.

In FIG. 1C, the layer stack is patterned with an etch mask 114, which may be a photoresist layer with a photolithographic process, to etch out openings to define future NMOS transistor geometry dimensions. The layer stack is then etched between the mask regions down to the substrate. These openings can be circular, square/rectangular or other channel cross-sectional shape. A directional/anisotropic etch is executed using this etch mask 114 to remove uncovered portions of the layer stack until reaching and uncovering the substrate 102.

Figure 1D:
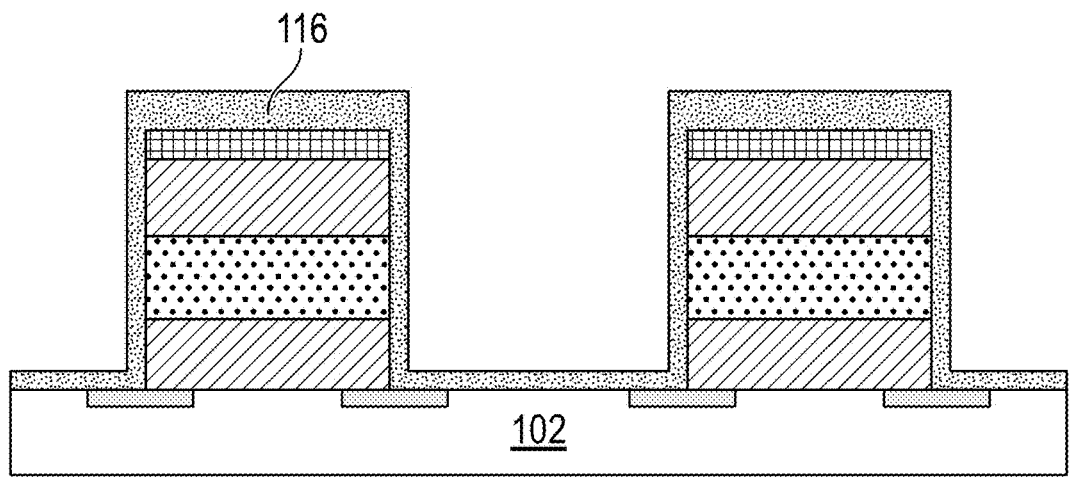
FIG. 1D illustrates a capping layer formed on the substrate, according to aspects of the present disclosure.

In FIG. 1D, the etch mask is removed followed by high-K dielectric 116 deposition, which can be conformal. High-K dielectrics suitable for use may be $Al_2O_3$, AlN, $ZrO_2$, $HfO_2$, $HfSiO_x$, ZrSiOx, HfOxNy, ZrOxNy, HfxZryOz, $Ta_2O_5$, $La_2O_3$, $Y_2O_3$, $Nb_2O_5$, $TiO_2$, $Pr_2O_3$, $Gd_2O_3$, SiBN, BCN, hydrogenated boron carbide and the like.

Figure 1E:
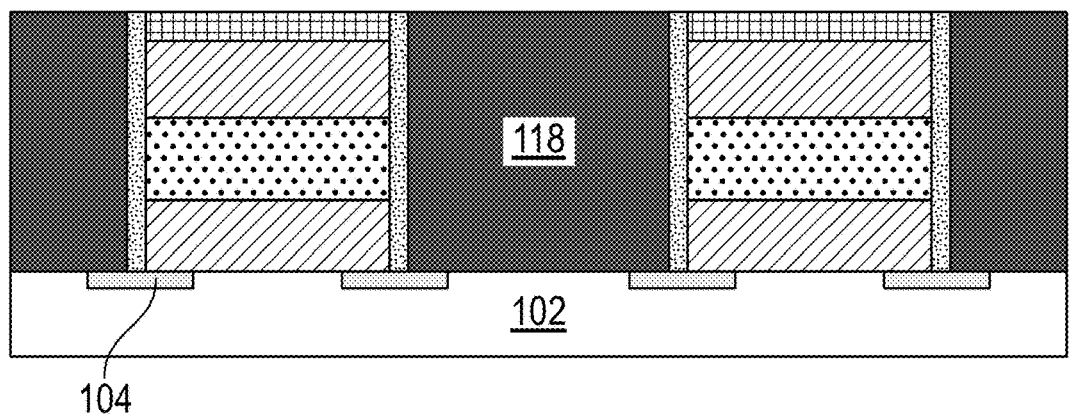
FIG. 1E shows N+ epitaxial growth in the openings, according to aspects of the present disclosure.

In FIG. 1E, a spacer etch can be executed to remove the high-K film from horizontal surfaces. A layer of N+ epitaxial material 118, is grown on the uncovered surfaces. Optionally, an N+ implant step can be executed to form source/drain connections between the stacks.

Figure 1F:
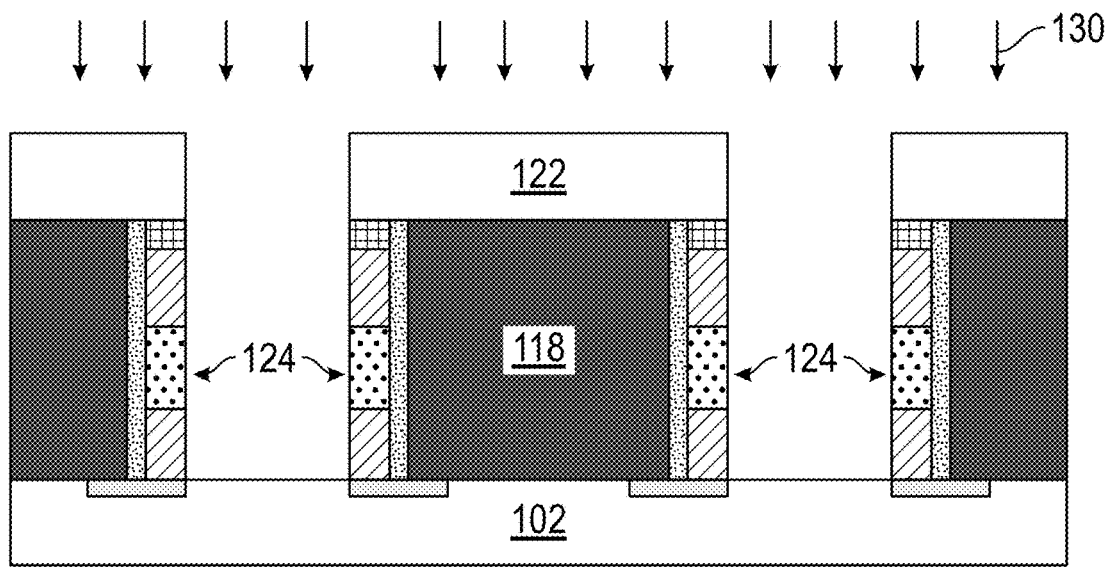
FIG. 1F shows openings formed to define gate electrodes with N+ implant doping of the substrate between the gate electrode stacks, according to aspects of the present disclosure.

In FIG. 1F, the substrate is processed by executing an etch to define separate metal gate electrode regions 124 self-aligned with dielectric stack. Thus, the N+ epitaxial material can be patterned with a mask 122 that extends beyond a diameter of the epi material to leave a sidewall structure on the epi material. The sidewall structure includes the dielectric-metal-dielectric stack.

Figure 1G:
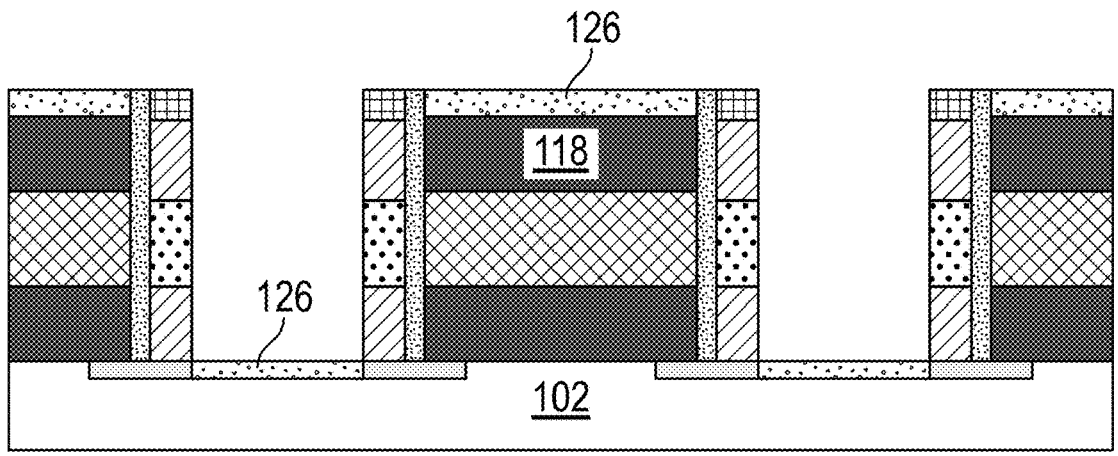
FIG. 1G shows formation of a silicide layer between the openings and on the tops of the stacks, according to aspects of the present disclosure.

FIG. 1G illustrates removal of the mask 122, followed by silicide 126 deposition, a spike anneal and then an etch to remove unreacted silicide. The annealed silicide forms salicide, which becomes source/drain connections between the stacks. The layer of silicide/salicide 126 on the top of N+ epi layer 118 forms part of the gate metal contact layer.

Figure 1H:
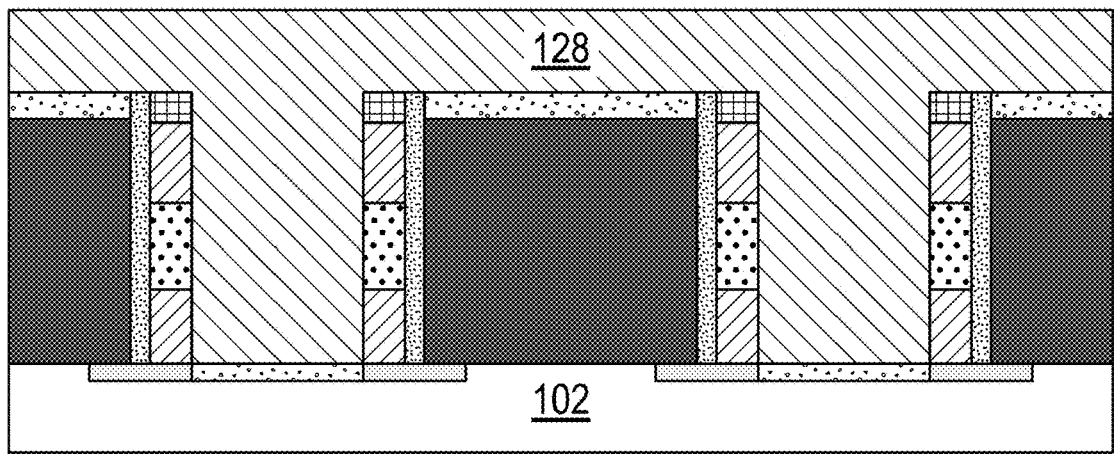
FIG. 1H shows a dielectric film covering the substrate and the stacks, according to aspects of the present disclosure.

In FIG. 1H, a dielectric film 128 is deposited and then planarized by etch back or chemical-mechanical polishing (CMP). The dielectric 128 should be etch selective to the second dielectric 110. Non-limiting examples of dielectric materials that are selective to each other are $Si_xO_y$, $Si_xN_y$, and $SiO_xN_y$, high-K, and (high-K) $O_xN_y$.

Figure 1I:
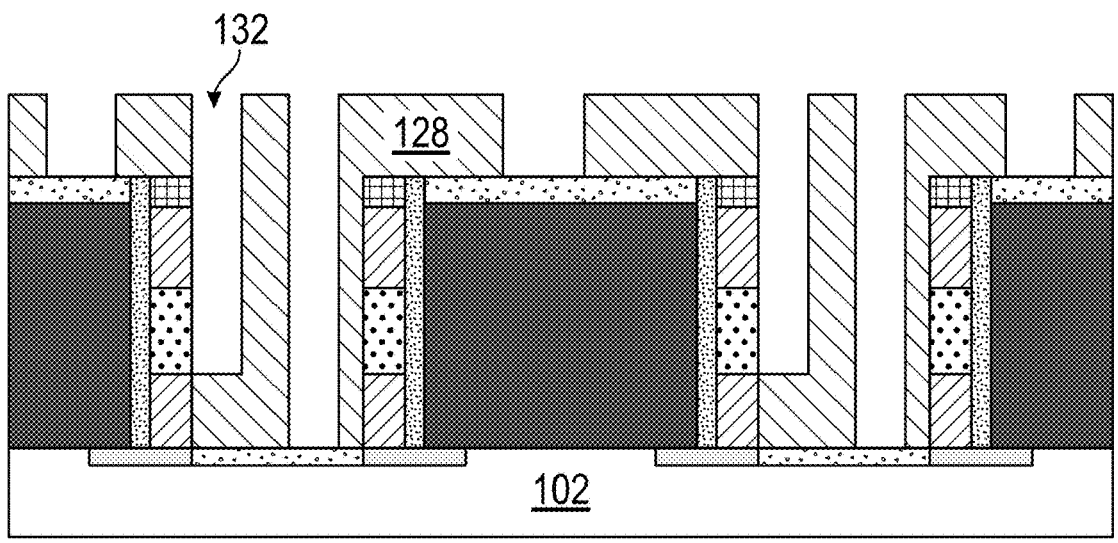
FIG. 1I shows via openings formed in the dielectric film, according to aspects of the present disclosure.

In FIG. 1I, the substrate is masked or patterned to etch via openings 132 in the dielectric film 128 for metal contacts.

Figure 1J:
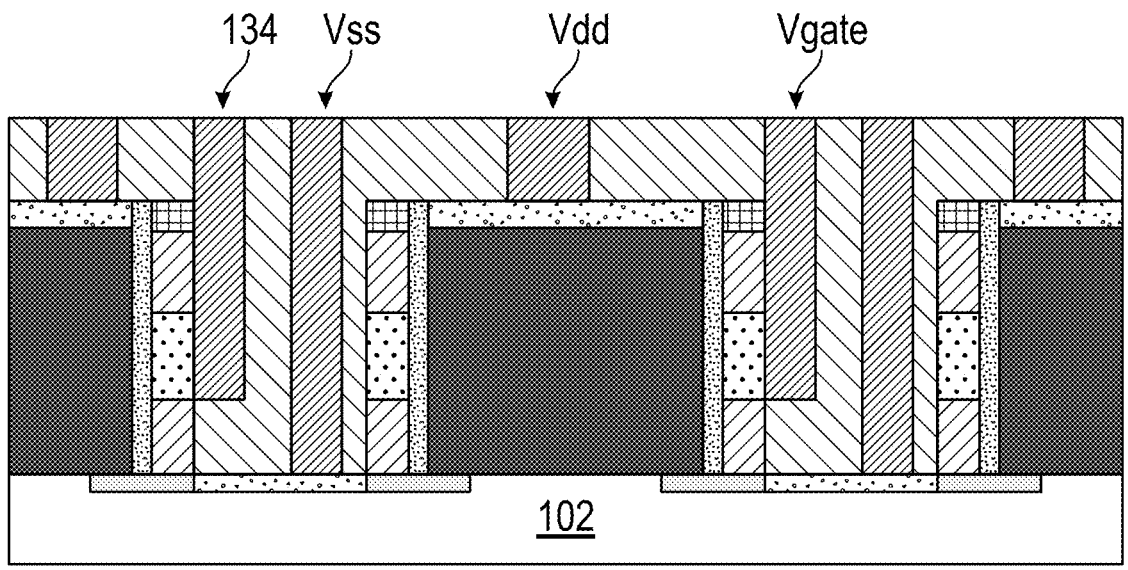
FIG. 1J shows metallization formed in the via openings, according to aspects of the present disclosure.

FIG. 1J shows the openings 132 filled with via metal 134. Metal can be deposited with overburden, with the overburden removed by chemical mechanical polishing, CMP. Accordingly, the NMOS devices are complete and additional wiring can be completed. The metal may consist of two or more metals in a stack.

A non-limiting example of an NMOS metal stack with the gate dielectric is a stack having an interfacial oxide layer, a hafnium oxide layer, HfO, and a titanium carbide layer, TiC. In a non-limiting example, after TiC deposition, a titanium nitride liner is deposited, followed by a tungsten, W, layer.

Figure 1K:
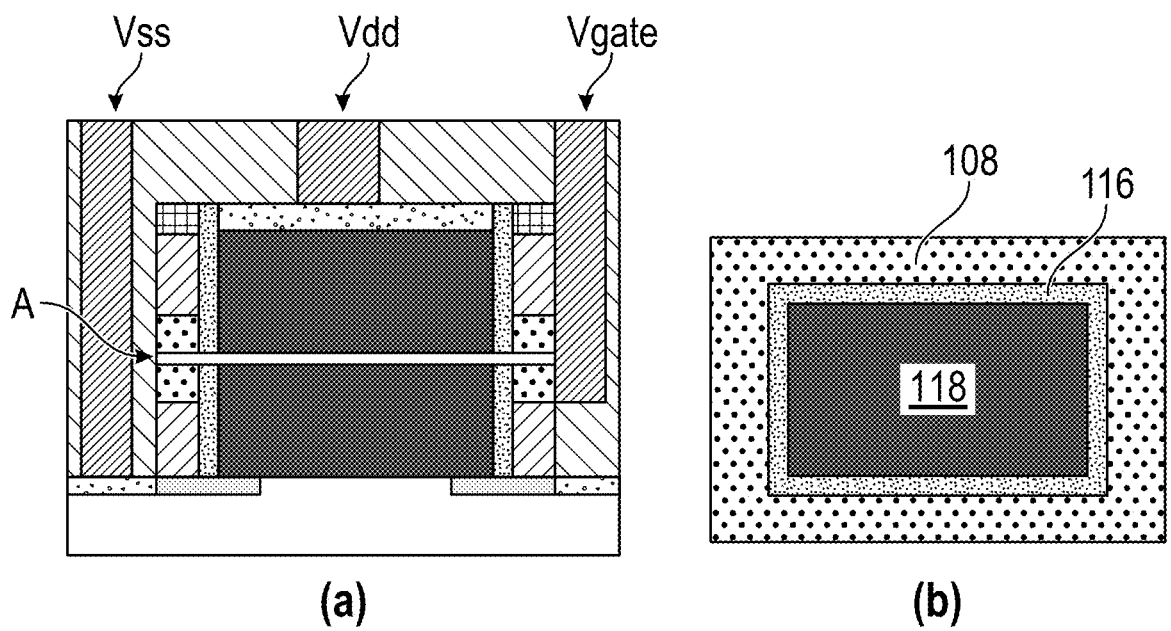
FIG. 1K shows (a) a side cross-section of a single NMOS transistor and (b) a top view of the NMOS transistor along a plane, according to aspects of the present disclosure.

FIG. 1K (a) shows a side cross section of a single NMOS device, showing the Vss, Vdd and Vgate contacts. The device shape can be 3D rectangular, circular, cylindrical, slotted, or otherwise. FIG. 1K (b) shows a center cross section along plane A cutting through FIG. 1K(a) of the NMOS device. The Vss source contacts and Vdd drain contacts are not shown in FIG. 1K(b). Shown are the gate dielectric 116, the Metal 1 108 gate electrode and the N+ epimaterial 118.

Figure 2A:
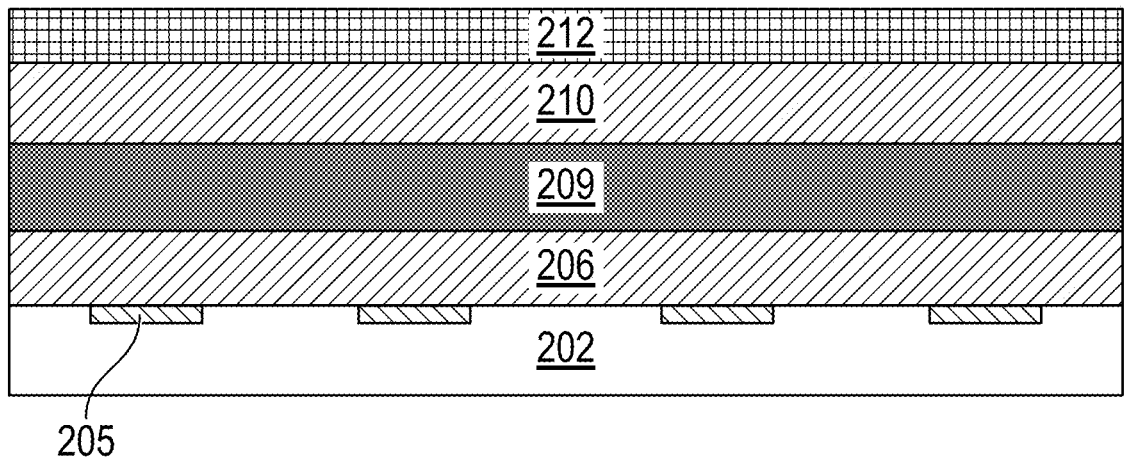
FIG. 2A illustrates a substrate with P+ implants and a layer stack, according to aspects of the present disclosure.
Figure 2B:
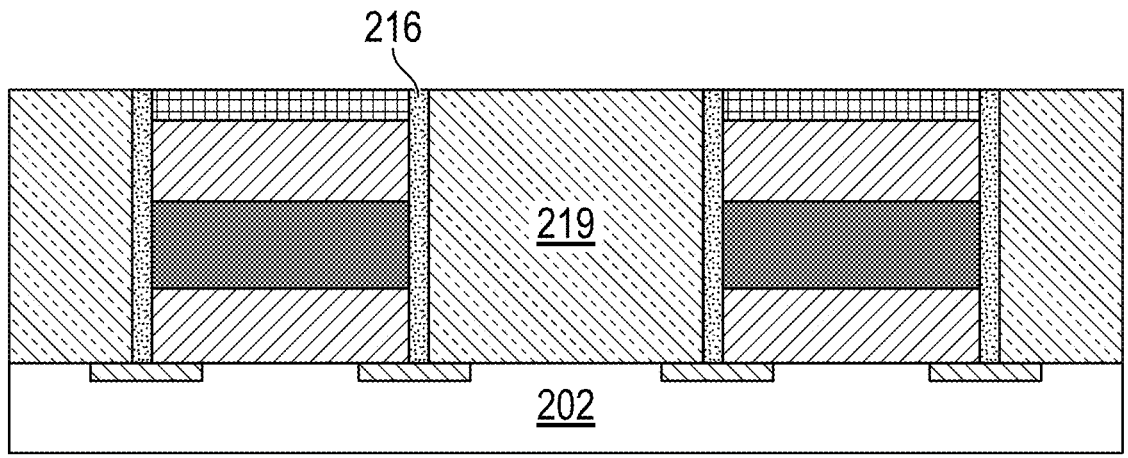
FIG. 2B illustrates openings formed in the layer stack with high-K material lining the sides of the openings and P+ epitaxial layers grown in the openings, with a high-K deposited on top of the P+ epitaxial layers, according to aspects of the present disclosure.
Figure 2C:
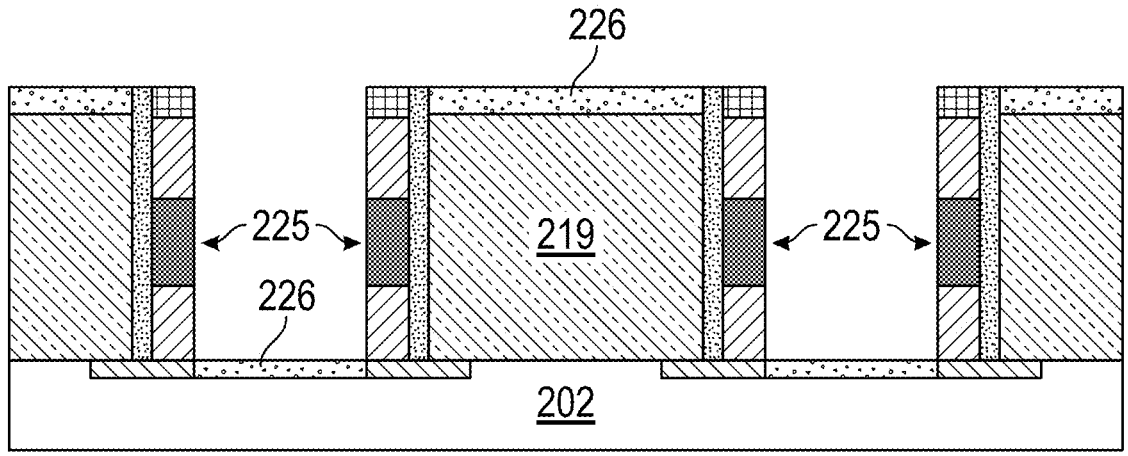
FIG. 2C shows openings formed to define PMOS gate electrodes with silicide formation on the substrate between the gate electrode stacks, according to aspects of the present disclosure.
Figure 2D:
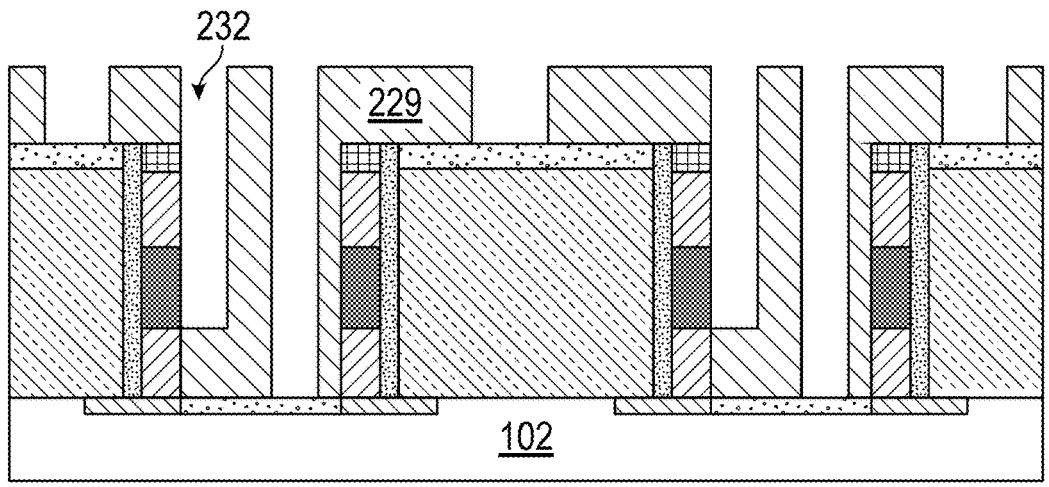
FIG. 2D shows a dielectric film formed over the substrate with etched openings for gate electrodes, according to aspects of the present disclosure.
Figure 2E:
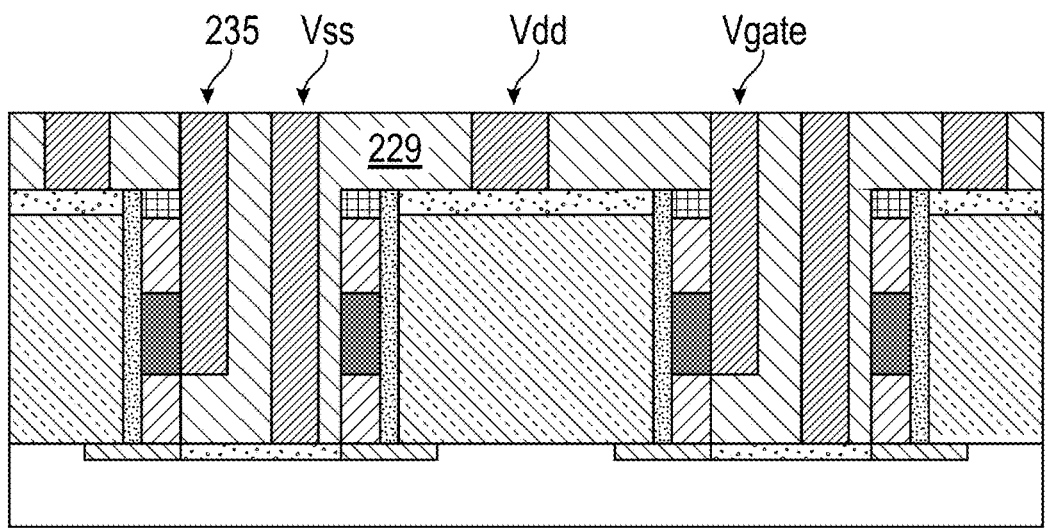
FIG. 2E shows via metal formed in the openings formed to define gate electrodes with N+ implant doping of the substrate between the gate electrode stacks, according to aspects of the present disclosure.
Figure 2F:
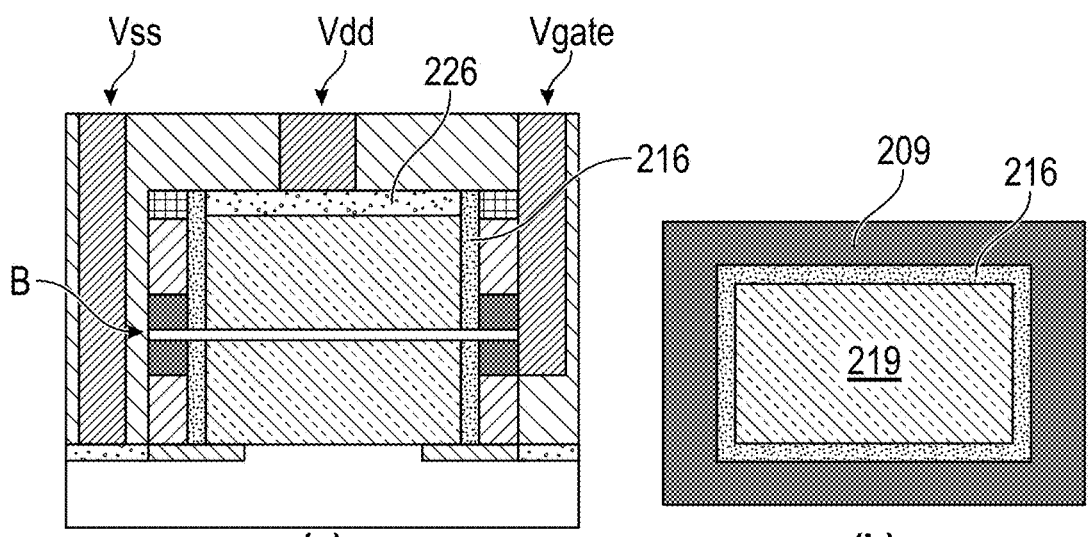
FIG. 2F shows (a) a side cross-section of a single PMOS transistor and (b) a top view of the PMOS transistor along a plane, according to aspects of the present disclosure.

FIGS. 2A-2F, Flow B, illustrate a 3D metal/oxide stack used to make a self-aligned metal gate electrode with work function suitable for PMOS devices. FIGS. 2A-2F are similar to FIGS. 1A-1K, except that there is P-type doping, and Metal 2 is used between dielectric layers instead of Metal 1. FIG. 2F shows a top view of a cross-sectional area, similar to FIG. 1K.

In FIG. 2A, a substrate 202 is patterned with a photoresist (not shown) and implanted with a P+ implant in areas not shown covered by the photoresist, similar to the process shown in FIG. 1A, and the doping mask is removed. The P+ dopants can be boron, gallium, indium or other P+ semiconductor material. Above this semiconductor layer, a layer stack is formed of alternating layers. This layer stack includes a dielectric layer 206, a Metal 2 layer 209 deposited on dielectric layer 206, and a dielectric layer 210 deposited on the Metal 2 layer 209. Dielectric layer 206 may be the same dielectric material or a different dielectric material than dielectric layer 210. A capping layer 212 is deposited as the top layer. The Metal 2 layer 209 will become a future gate electrode of the PMOS device. In a non-limiting example, dielectric layer 206 may be an oxide and Metal 2 may be selected from the ruthenium, Ru, tantalum nitride, TaN, titanium nitride, TiN, and tungsten, W, titanium carbide, TiC, gallium, Ga, gadolinium, Gd, titanium oxy nitride, TiON, tantalum silicon nitride, TaSiN, titanium silicon nitride, TiSiN, molybdenum, Mo, tungsten nitride, WN, aluminum, Al, copper, Cu, and combinations. In a non-limiting example, the capping layer 212 is titanium nitride, TiN.

FIG. 2B combines steps similar to those shown in FIG. 1C-1E for the NMOS transistor. The layer stack is patterned by a photolithographic process to etch out openings to define future PMOS transistor geometry dimensions. The layer stack is then etched between the mask regions down to the substrate. These opening can be circular, square/rectangular or other channel cross-sectional shape. The substrate is covered by deposition of a high-K dielectric 216, which can be conformal. High-K dielectrics may be $Al_2O_3$, AlN, $ZrO_2$, $HfO_2$, $HfSiO_x$, ZrSiOx, HfOxNy, ZrOxNy, HfxZryOz, $Ta_2O_5$, $La_2O_3$, $Y_2O_3$, $Nb_2O_5$, $TiO_2$, $Pr_2O_3$, $Gd_2O_3$, SiBN, BCN, hydrogenated boron carbide and the like. A spacer etch is executed to remove the high-K dielectric from horizontal surfaces. A layer P+ epitaxial material 219, is grown on the uncovered, P+ regions 205 and the uncovered substrate between the P+ regions 205.

FIG. 2C combines steps similar to those shown in FIG. 1F-1G for the NMOS transistor. In FIG. 2C, the substrate is processed by executing an etch to define separate metal gate electrode regions 225 self-aligned with dielectric stack. Thus, the P+ epitaxial material 219 can be patterned with a mask (not shown) that extends beyond a diameter of the epi material to leave a sidewall structure on the epi material. The sidewall structure includes the dielectric-metal-dielectric stack. Optionally, a P+ implant step can be executed to form source/drain connections between the stacks. The P+ implant step is followed by silicide 226 deposition, a spike anneal and then an etch to remove unreacted silicide. The annealed silicide forms salicide, which becomes source/drain connections between the stacks. The layer of silicide/salicide 226 on the top of P+ epitaxial material 219 forms part of the gate metal contact layer.

FIG. 2D combines steps similar to those shown in FIG. 1H-1I for the NMOS transistor. A dielectric film 229 is deposited and then planarized by etch back or CMP. The dielectric film 229 should be etch selective to the second dielectric 210. Non-limiting examples of dielectric materials that are selective to each other are $Si_xO_y$, $Si_xN_y$, and $SiO_xN_y$, high-K, and (high-K) $O_xN_y$. The substrate is then masked or patterned to etch via openings 232 in the dielectric film 229 for metal contacts.

In FIG. 2E, the openings 232 are filled with via metal 235. Metal can be deposited with overburden, with the overburden removed by CMP. Accordingly, the PMOS devices are complete and additional wiring can be completed. A non-limiting example of a PMOS metal stack with the gate dielectric is a stack having an interfacial oxide layer, a halfnium oxide layer, HfO, and a titanium nitride layer, TiN. In a non-limiting example, after TiN deposition, a titanium oxy nitride liner is deposited, followed by a titanium carbide layer, TiC. In a non-limiting example, after TiC deposition, a TiN liner is formed followed by a tungsten, W, layer.

FIG. 2F(a) shows a side cross section of a single PMOS device, showing the Vss, Vdd and Vgate contacts. Note that the device shape can be 3D rectangular, circular, cylindrical, slotted, or otherwise. FIG. 2F (b) shows a center cross section along plane B cutting through FIG. 2F(a) of the PMOS device. The Vss source contacts and Vdd drain contacts are not shown in FIG. 2F(b). Shown are the gate electrode of Metal 2 209 which connects to Vgate, the P+ epitaxial material 219 and the gate dielectric 216.

FIGS. 3A-3M, Flow C, illustrate an example of CMOS flow using dual metal work function stacks using a 3D metal/oxide stack to enable self-aligned metal gate electrode with dual work function suitable for CMOS devices using a silicon/oxide/silicon substrate. The process flow of FIGS. 3A-3M is similar to the previous process flows, but stepwise masking and uncovering is used for different doping and materials. N+ and P+ regions are separately masked and doped (FIGS. 3I, 3J).

Figure 3A:
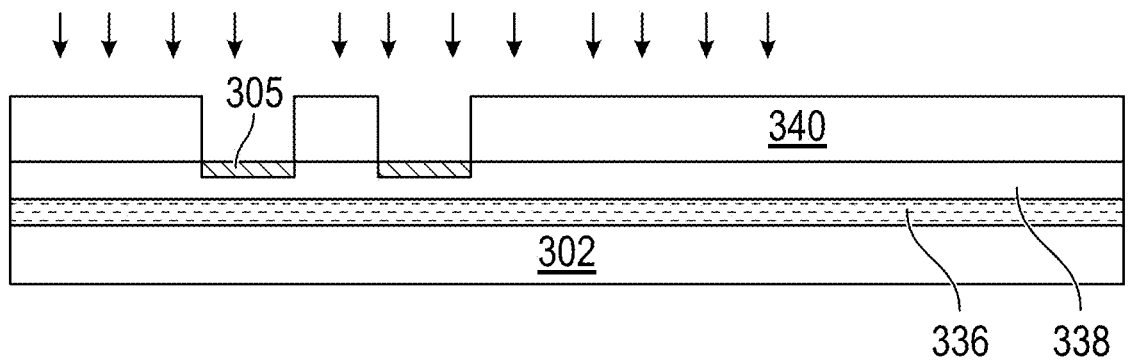
FIG. 3A shows a substrate stack having a diffusion layer and a silicon layer with P+ implantation in patterned openings, according to aspects of the present disclosure.

FIG. 3A shows a substrate 302, a dielectric layer 336 formed on the substrate (e.g., deposited) and a silicon layer 338 formed on the dielectric layer. The dielectric layer provides isolation between the silicon layer and the substrate. The dielectric layer can include oxide based (e.g. SiOx, SiOxNy based) dielectric materials. A first patterned photomask 340 of photoresist can be formed to define areas for P+ implantation (see rays) doping. The P+ dopants can be boron, gallium, indium or other P+ semiconductor material. The photomask covers the substrate in the region where the NMOS devices will be formed. P+ implant 305 regions are formed in silicon layer 338. Subsequently, the first photomask 340 is removed.

Figure 3B:
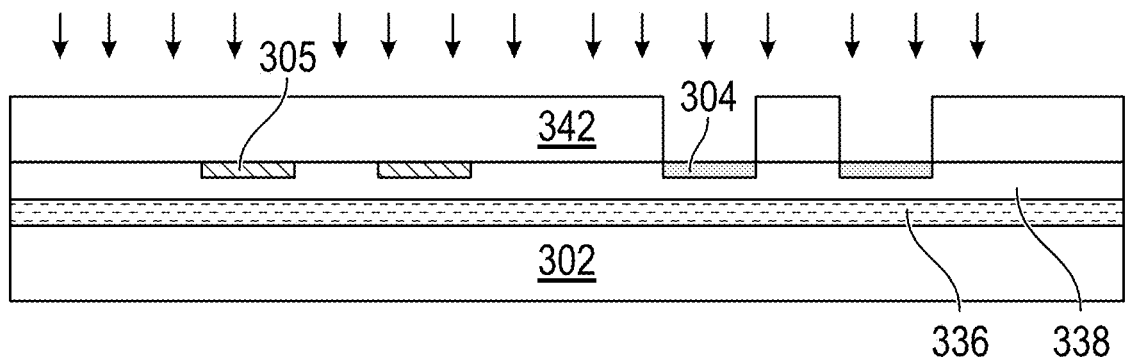
FIG. 3B shows a patterned mask and N+ implantation of the silicon layer in uncovered regions, according to aspects of the present disclosure.

In FIG. 3B, a second photoresist mask 342 is patterned to cover the P+ implant 305 regions and define areas for N+ implantation (see rays) doping. The N+ dopants can be phosphorous, arsenic or other P+ semiconductor material. N+ implant 304 regions are formed in the silicon layer 338. Subsequently, the second photomask 342 is removed.

Figure 3C:
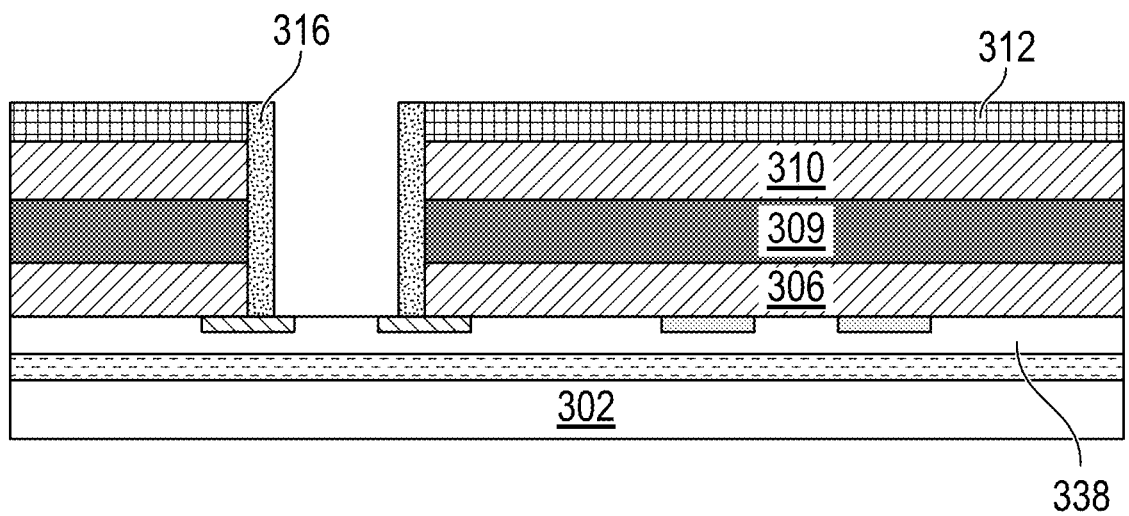
FIG. 3C shows a layer stack formed over the P+ implant with an opening lined with high-K material, according to aspects of the present disclosure.

In FIG. 3C, a layer stack is formed across the substrate covering both dopant types. This layer stack includes a dielectric layer 306, a Metal 2 layer 309 deposited on dielectric layer 306, and a dielectric layer 310 deposited on the Metal 2 layer 309. Dielectric layer 306 may be the same dielectric material or a different dielectric material from layer 310. A capping layer 312 is deposited as the top layer. The Metal 2 layer 309 will become a future gate electrode of the PMOS device. In a non-limiting example, dielectric layer 306 may be oxide and Metal 2 may be selected from the group comprising ruthenium, Ru, tantalum nitride, TaN, titanium nitride, TiN, and tungsten, W, titanium carbide, TiC, gallium, Ga, gadolinium, Gd, titanium oxy nitride, TiON, tantalum silicon nitride, TaSiN, titanium silicon nitride, TiSiN, molybdenum, Mo, tungsten nitride, WN, aluminum, Al, copper, Cu, and combinations. In a non-limiting example, the capping layer 312 is titanium nitride, TiN.

A third photomask (not shown) is patterned on the capping layer 312 to cover the N+ regions. A directional/anisotropic etch is executed using to remove uncovered portions of the layer stack until reaching the P+ implant and silicon layer 338. These openings can be circular, square/rectangular or other channel cross-sectional shape. The third photomask is removed, followed by a high-K deposit. A spacer etch can be executed to remove the high-K deposit from horizontal surfaces, leaving only the sides of the opening covered. High-K dielectrics may be $Al_2O_3$, AlN, $ZrO_2$, $HfO_2$, $HfSiO_x$, ZrSiOx, HfOxNy, ZrOxNy, HfxZryOz, $Ta_2O_5$, $La_2O_3$, $Y_2O_3$, $Nb_2O_5$, $TiO_2$, $Pr_2O_3$, $Gd_2O_3$, SiBN, BCN, hydrogenated boron carbide and the like.

Figure 3D:
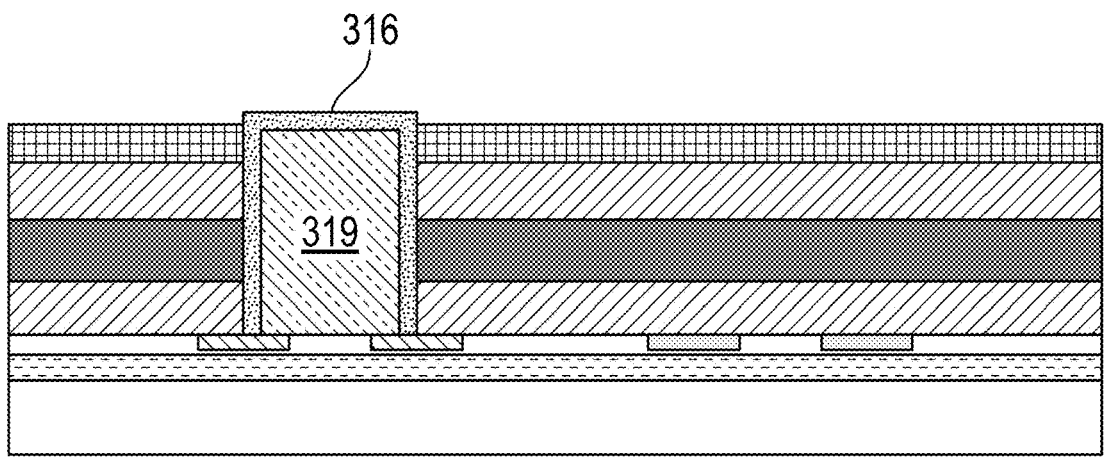
FIG. 3D shows the opening filled with P+ epitaxial material with a capping layer, according to aspects of the present disclosure.

In FIG. 3D, a layer of P+ epitaxial material 319, is grown on the uncovered, P+ regions. A selective deposition of high-K material 316 is executed to cover the top of the P+ epitaxial material 319.

Figure 3E:
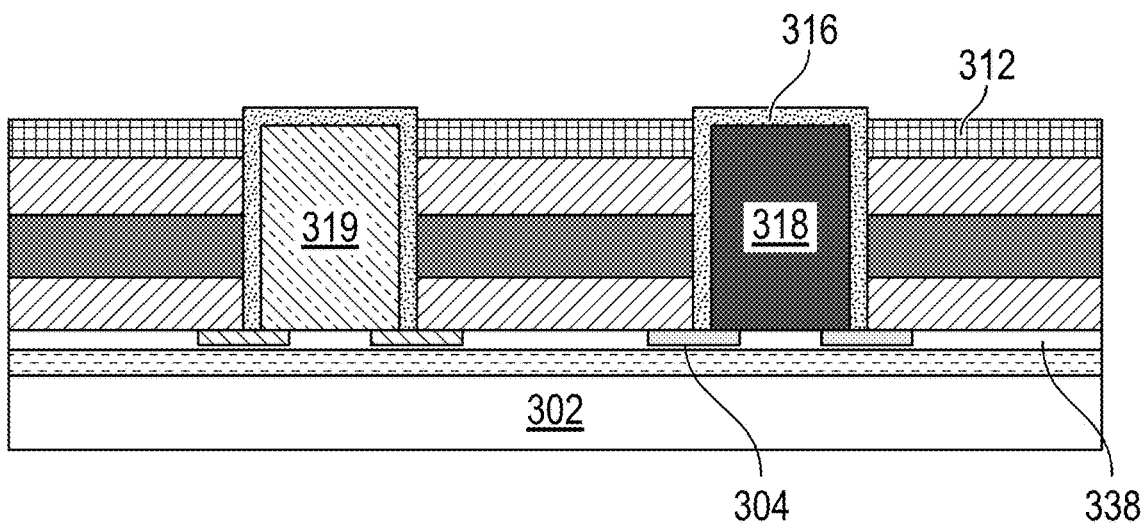
FIG. 3E shows an opening filled with N+ epitaxial material with a capping layer, according to aspects of the present disclosure.

In FIG. 3E, the substrate is stepwise masked to cover the P+ regions. A fourth photomask (not shown) is patterned on the substrate. A directional/anisotropic etch is executed using to remove uncovered portions of the layer stack until reaching the N+ implant 304 and silicon layer 338. These openings can be circular, square/rectangular or other channel cross-sectional shape. The fourth photomask is removed, followed by depositing a high-K material 316. A spacer etch is then executed to remove the high-K film from horizontal surfaces, leaving only the sides of the opening covered with high-K material 316. The openings for the N+ epi regions can be the same width, a larger width, or a smaller width than the openings formed for the P+ epi regions. Additionally, the thickness of the high-K material on the sides may be different than the thickness of the high-K layer which covers the P+ epi regions. A layer N+ epitaxial material 318 is grown in the opening on the uncovered, N+ implant 304 regions and the uncovered silicon 338 between the P+ implant 305 regions. A capping layer of high-K material 316 (or other material) can be added to cover the N+ epitaxial material 318 regions. The high-K material may be the same material as that used to cover the N+ epitaxial material 318 regions or may be a different material. Selection of these thickness and material parameters allows for the formation of NMOS and PMOS transistors having different threshold voltages, $V_t$.

Figure 3F:
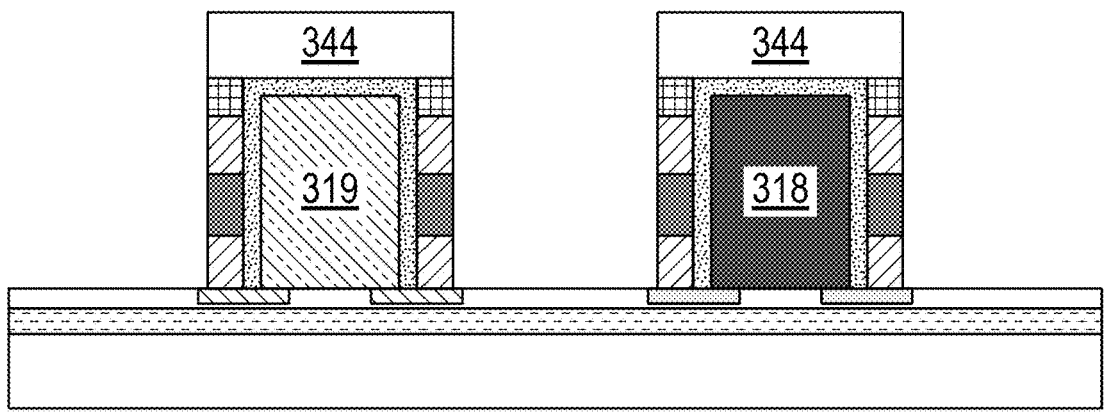
FIG. 3F shows masking of the P+ and N+ epitaxial layers and etched opening to define gate electrode regions, according to aspects of the present disclosure.

In FIG. 3F, a photomask 344 is patterned to cover the N+ and P+ epitaxial regions and portions of the dielectric stack that extend beyond the diameters of the N+ and P+ epi material to leave sidewall structures around the N+ and P+ epi material. The sidewall structures include the dielectric-metal-dielectric stack. The uncovered regions of the dielectric stack are then etched to define NMOS and PMOS gate electrode regions that are self-aligned, thus forming dielectric stack/metal gate electrodes.

Figure 3G:
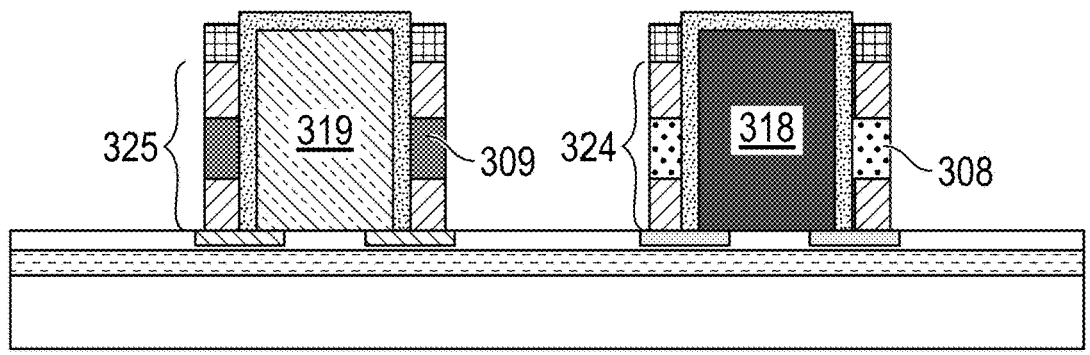
FIG. 3G shows replacement of Metal 2 by Metal 1 in the N+ gate electrode, according to aspects of the present disclosure.

In FIG. 3G, P+ regions are covered while Metal 2 is removed from N+ epi stack regions. Metal 1 308 is formed in the gate opening in the N+ epi stack. Metal 1 can be selected from the group comprising ruthenium, Ru, tantalum nitride, TaN, titanium nitride, TiN, and tungsten, W, titanium carbide, TiC, gallium, Ga, gadolinium, Gd, titanium oxy nitride, TiON, tantalum silicon nitride, TaSiN, titanium silicon nitride, TiSiN, molybdenum, Mo, tungsten nitride, WN, aluminum, Al, copper, Cu, and combinations. In a non-limiting example, the capping layer is titanium nitride, TiN.

At this point, the NMOS gates 324 and PMOS gates 325 have different metal work functions due to the different metals.

Figure 3H:
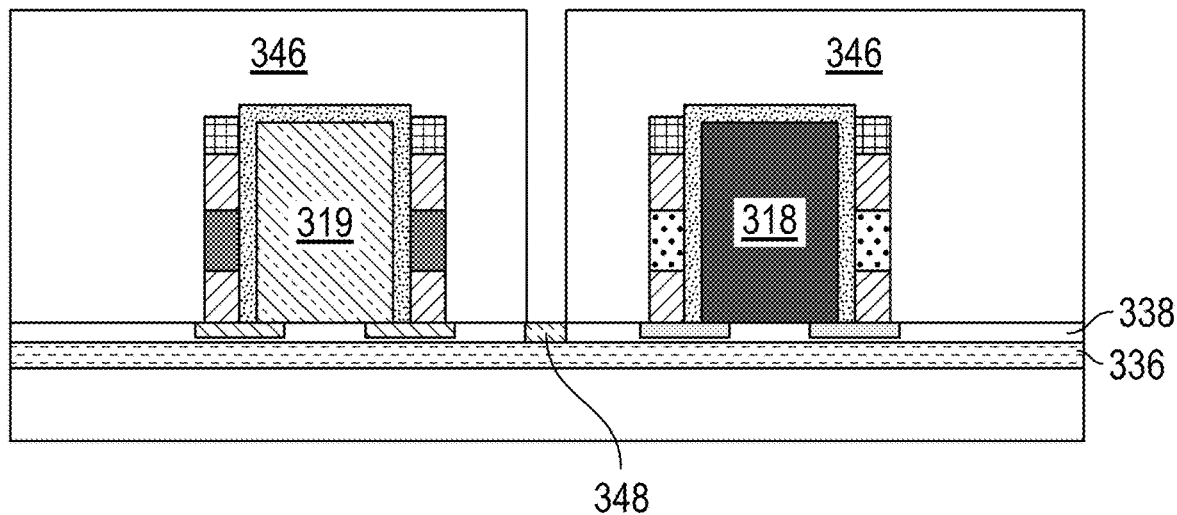
FIG. 3H shows masking and deposition of a diffusion break between the PMOS and NMOS transistors, according to aspects of the present disclosure.
Figure 3I:
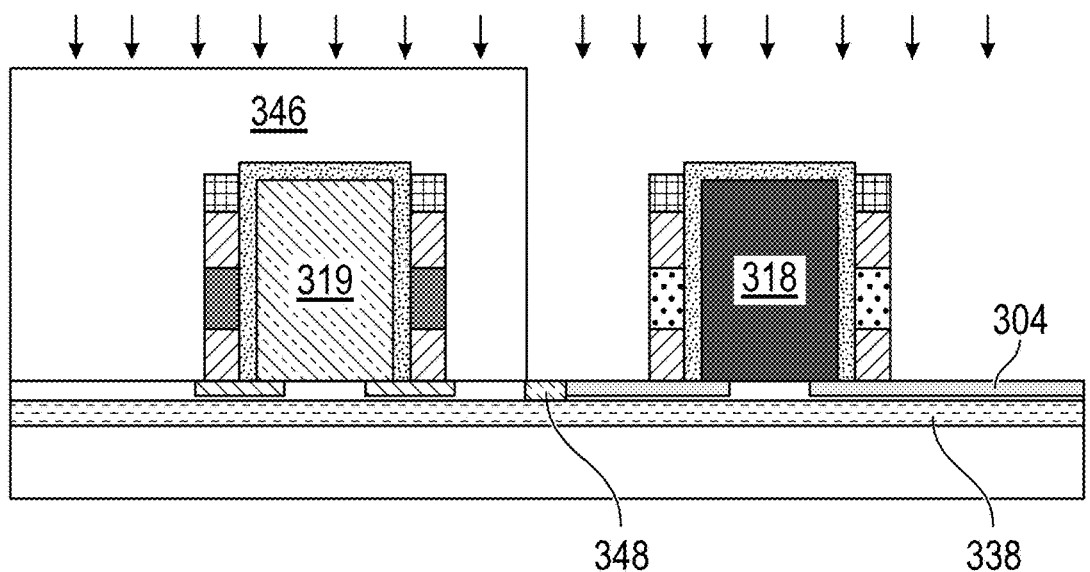
FIG. 3I shows masking of the PMOS transistor and N+ implantation on the exposed silicon substrate layer, according to aspects of the present disclosure.
Figure 3J:
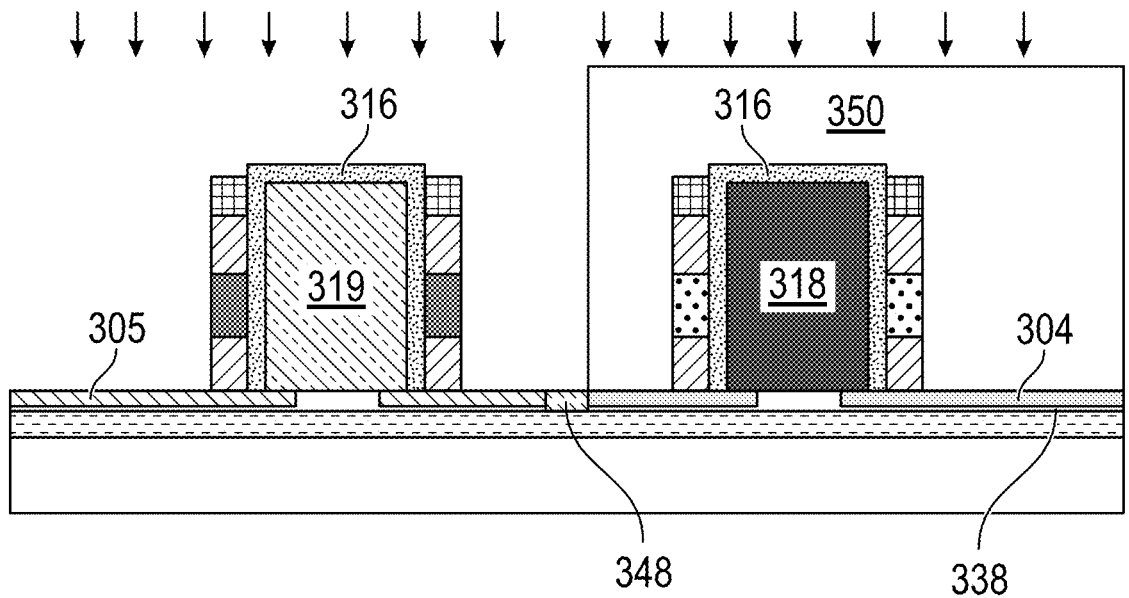
FIG. 3J shows masking of the NMOS transistor and P+ implantation on the exposed silicon substrate layer, according to aspects of the present disclosure.

In FIG. 3H, the substrate is patterned with photomask 346 to etch an isolation diffusion break region 348 to isolate the NMOS and PMOS devices/regions. The silicon layer 338 of the underlying substrate is etched down to dielectric layer 336 and the opening is replaced with a dielectric.

In FIG. 3I, the photomask 346 is removed from the N+ region and an N+ implant is executed to dope the floor semiconductor material with N+ implant 304. Optionally, a silicide layer may be deposited on the N+ implant or instead of the N+ implant, followed by a spike anneal to convert the silicide to salicide.

In FIG. 3J, photomask 346 is removed and the N+ implant 304 region is covered with photomask 350. A P+ implant is executed to dope the floor silicon layer 338 material with P+ implant 305. Optionally, a silicide layer may be deposited on the P+ implant 305 or instead of the P+ implant 305, followed by a spike anneal to convert the silicide to salicide.

Figure 3K:
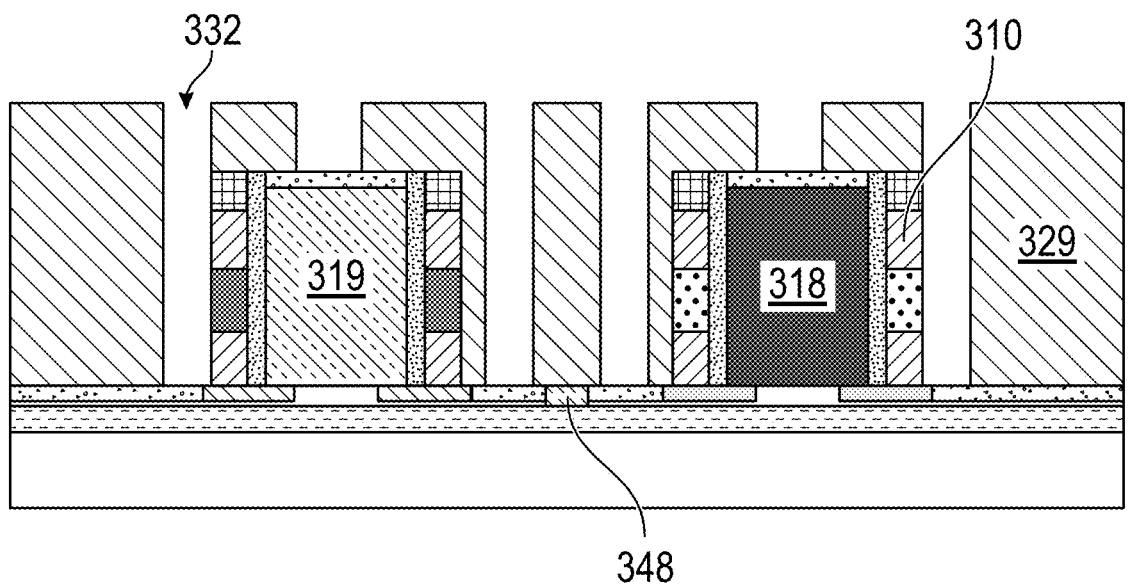
FIG. 3K shows a dielectric film formed over the substrate with etched via openings, according to aspects of the present disclosure.

In FIG. 3K, the photomask 350 is removed as well as high-K material 316 from the tops of the vertical channel structures. A dielectric film 329 is deposited and then planarized by etch back or CMP. The dielectric film 329 should be etch selective to the dielectric layer 310. The substrate is then masked or patterned to etch via openings 332 in the dielectric film 329 for metal contacts.

Figure 3L:
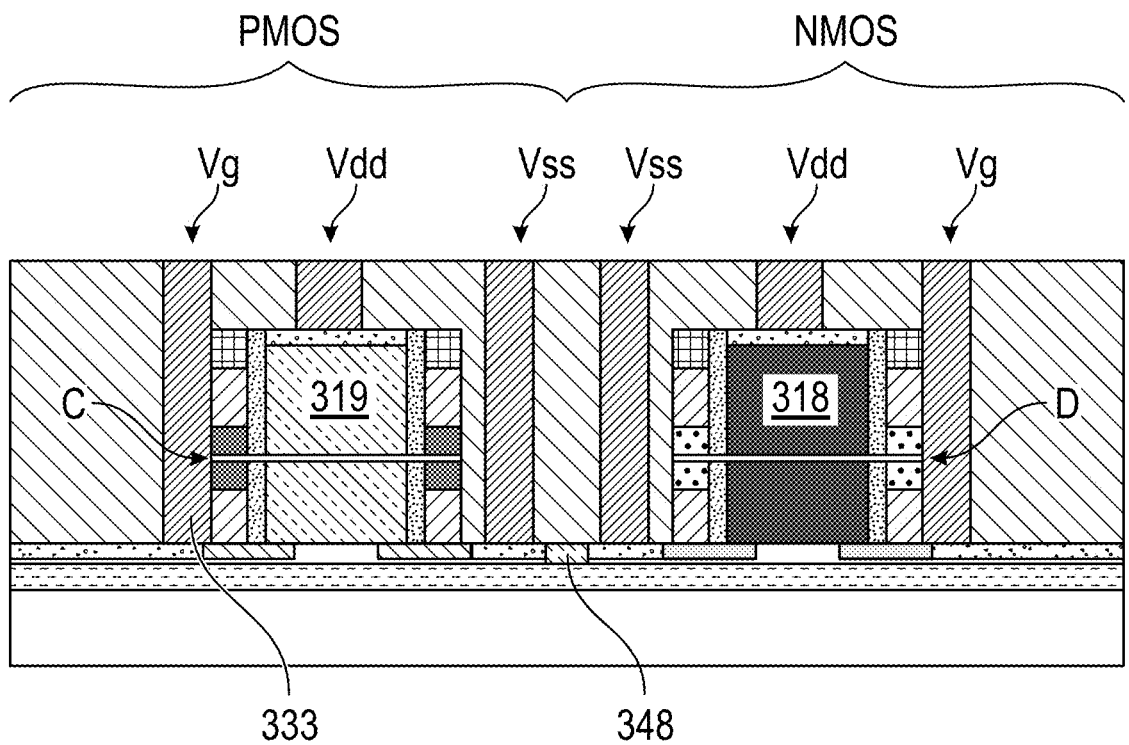
FIG. 3L shows a cross-sectional side view of the finished PMOS and NMOS transistors on a single substrate with metallization completed and a diffusion break between the transistors, according to aspects of the present disclosure.

FIG. 3L shows the metallization of via metal 333.

Figure 3M:
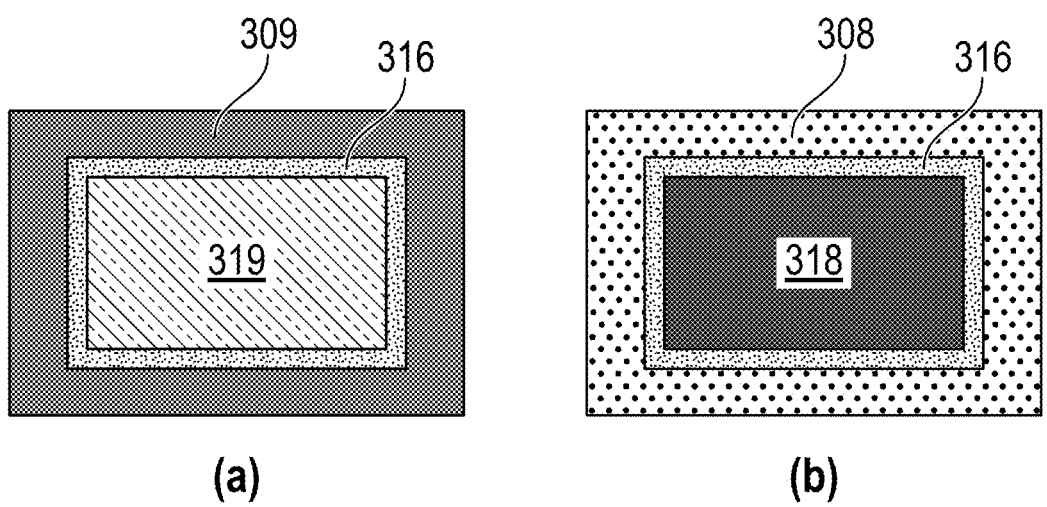
FIG. 3M shows (a) a top cross-section of the PMOS device, and (b) a top cross-section of the NMOS device, according to aspects of the present disclosure.

FIG. 3M shows (a) a top cross section of the PMOS transistor taken at plane C (shown in FIG. 3L) and (b) a top cross section of the NMOS transistor taken at plane D (shown in FIG. 3L). The Vss source contacts and Vdd drain contacts are not shown in FIG. 3M. In FIG. 3M(a), the gate electrode (Vgate) connects to Metal 2 layer 309, the channel is formed by P+ epitaxial material 319 and a gate dielectric by high K material 316. In FIG. 3M(b), gate electrode of Metal 1 308 is shown which connects to Vgate, and an N+ channel formed by N+ epitaxial material 318 and a gate dielectric formed by high K material 316 are shown.

FIGS. 4A-4G, Flow D, illustrate an example of CMOS flow using dual metal work function stacks using a 3D metal/oxide stack to enable self-aligned metal gate electrode with dual work function suitable for CMOS devices using a silicon substrate with a diffusion break. These figures are an alternative flow for achieving side-by-side NMOS and PMOS devices.

Figure 4A:
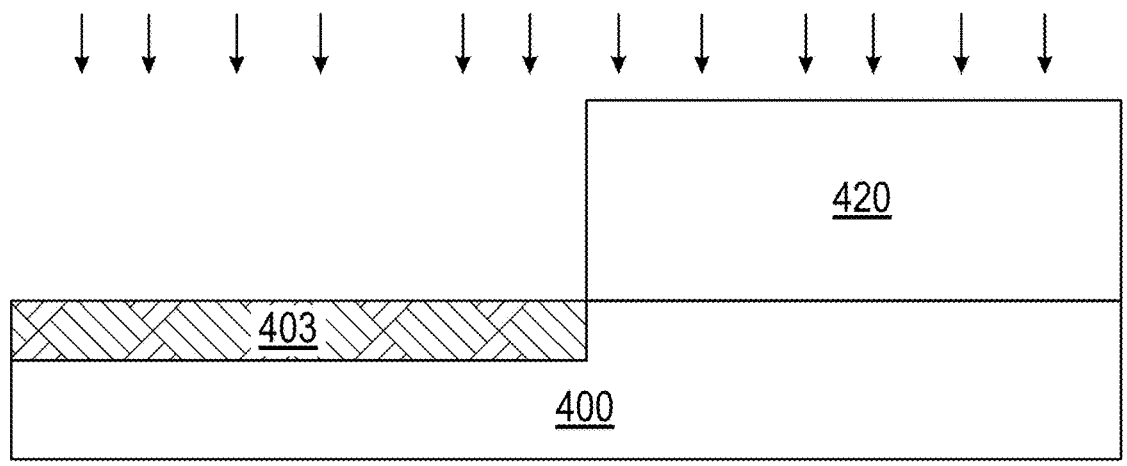
FIG. 4A shows N-type implantation of a P-type substrate, according to aspects of the present disclosure.

In FIG. 4A, a P-type substrate 400 is patterned with photomask 420 to cover a portion of the P-type region of the substrate. An N-type implant process is executed to form an N-type background doped region 403.

Figure 4B:
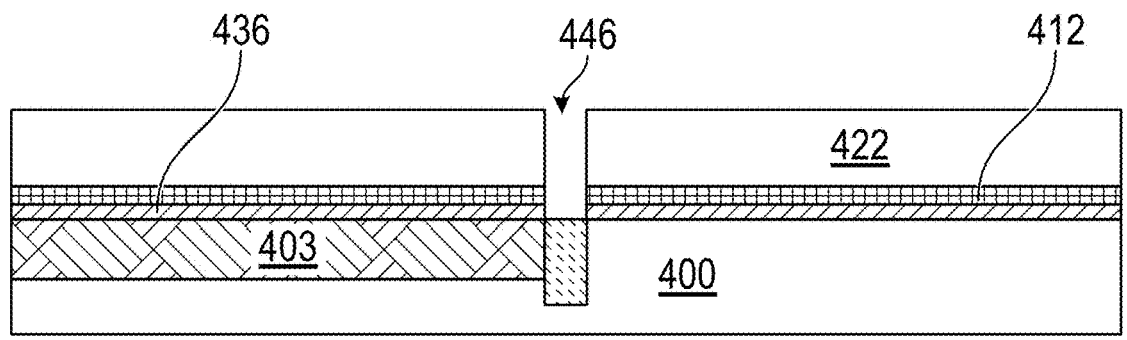
FIG. 4B shows a diffusion break formed between the N-type and P-type regions of the substrate, according to aspects of the present disclosure.

In FIG. 4B, photomask 420 is removed. A dielectric layer 446 is deposited on the P-type substrate 404. The dielectric layer can include oxide based (e.g. SiOx, SiOxNy based) dielectric materials. A capping layer 412 is deposited on the dielectric layer. A photomask 422 is patterned on the capping layer 412 to leave an opening between the N-type and P-type regions. A dielectric is diffused into this opening to form a dielectric diffusion break 446. After forming the dielectric diffusion break 446, the substrate is planarized to remove the photomask 422, the capping layer 412 and the dielectric layer 436 by etch back or CMP, followed by an anneal to complete the diffusion isolation break between future NMOS and PMOS regions.

Figure 4C:
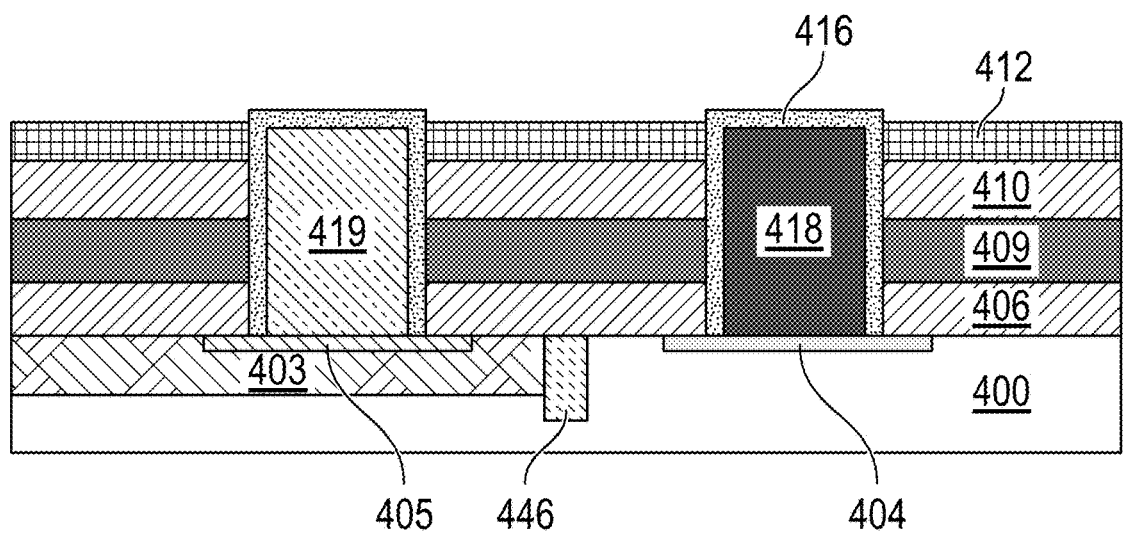
FIG. 4C shows a P+ layer implanted on the N-type substrate, an N+ layer implanted on the P-type substrate, P+ epitaxial growth over the P+ implant layer, N+ epitaxial growth over the N+ implant layer, with high-K material surrounding the epitaxial regions, according to aspects of the present disclosure.

As illustrated in FIG. 4C, stepwise masking and implantation for N+ implant 404 regions and P+ implant regions 405 is executed similar to the processing of FIGS. 3A and 3B to form S/D connections for N+ and P+ regions. A dielectric layer 406 is deposited on the substrate, a Metal 2 layer 409 is deposited on the dielectric layer 406, a dielectric layer 410, which can be the same dielectric material as layer 408 or a different dielectric material, and a capping layer 412 is deposited on dielectric layer 410. The Metal 2 layer 409 will become a future gate electrode of the PMOS device. In a non-limiting example, dielectric layer 406 may be an oxide and Metal 2 may be selected from the group comprising ruthenium, Ru, tantalum nitride, TaN, titanium nitride, TiN, and tungsten, W, titanium carbide, TiC, gallium, Ga, gadolinium, Gd, titanium oxy nitride, TiON, tantalum silicon nitride, TaSiN, titanium silicon nitride, TiSiN, molybdenum, Mo, tungsten nitride, WN, aluminum, Al, copper, Cu, and combinations. In a non-limiting example, the capping layer 412 is titanium nitride, TiN.

Figure 4D:
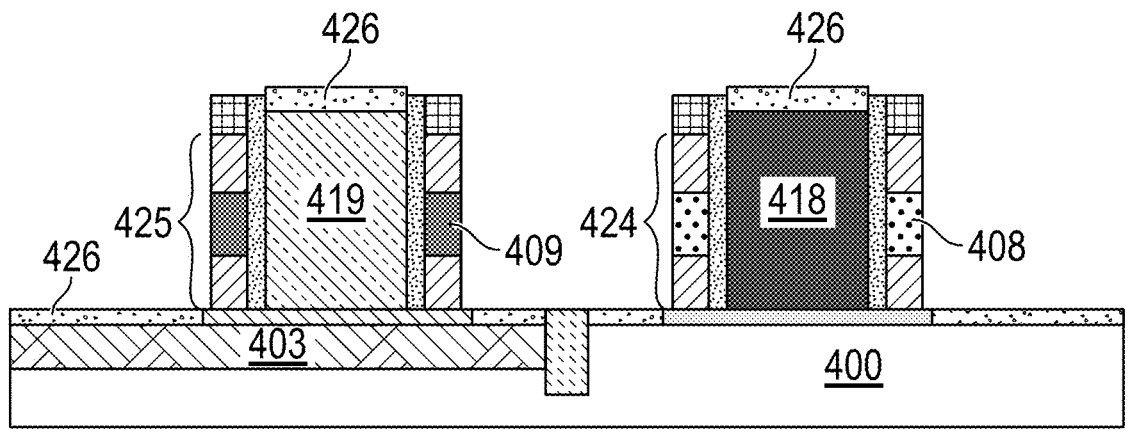
FIG. 4D shows replacement of Metal-2 with Metal 1 in the NMOS stack, with salicide formation on the substrate and tops of the PMOS and NMOS stacks, according to aspects of the present disclosure.

Similarly to the processing step shown in FIG. 3C, a photomask is patterned over the N+ implant region and a directional/anisotropic etch is executed using to remove uncovered portions of the layer stack until reaching the P+ implant and P-type substrate 338. These openings can be circular, square/rectangular or other channel cross-sectional shape. The photomask is removed, followed by a high-K deposit 416. A spacer etch can be executed to remove the high-K film from horizontal surfaces, leaving only the sides of the opening covered. High-K dielectrics may be $Al_2O_3$, AlN, $ZrO_2$, $HfO_2$, $HfSiO_x$, ZrSiOx, HfOxNy, ZrOxNy, HfxZryOz, $Ta_2O_5$, $La_2O_3$, $Y_2O_3$, $Nb_2O_5$, $TiO_2$, $Pr_2O_3$, $Gd_2O_3$, SiBN, BCN, hydrogenated boron carbide and the like. Similarly to the processing steps shown in FIGS. 1C-1E and FIG. 3D, a layer of P+ epitaxial material 419, is grown on the uncovered, P+ regions. A selective deposition of high-K material 416 is executed to cover the top of the P+ epitaxial material 419. Similarly to the processing steps shown in FIGS. 2B and 3E, the stack is stepwise masked to cover the P+ regions. A directional/anisotropic etch is executed using to remove uncovered portions of the layer stack until reaching the N+ implant 404 and P-type substrate 400. These openings can be circular, square/rectangular or other channel cross-sectional shape. The photomask is removed, followed by a high-K film 416. A spacer etch is then executed to remove the high-K film from horizontal surfaces, leaving only the sides of the opening covered with high-K film 416. The openings for the N+ epi regions can be the same width, a larger width, or a smaller width than the openings formed for the P+ epi regions. Additionally, the thickness of the high-K material on the sides may be different than the thickness of the high-K layer which covers the P+ epi regions. A layer N+ epitaxial material 418 is grown in the opening on the uncovered, N+ regions 404 and the uncovered P-type substrate 400 between the P+ regions 305. A high-K cap 416 (or other material) can be added to cover the N+ epi material 418. The high-K cap 416 may be the same material as that used to cover the N+ epi regions or may be a different material. Selection of these thickness and material parameters allows for the formation of NMOS and PMOS transistors having different threshold voltages, $V_t$. FIG. 4D illustrates formation of the gate electrode regions of PMOS and NMOS using processing steps similar to those previously discussed with respect to FIGS. 1F, 2C and 3F. A photomask is patterned to cover the N+ and P+ epitaxial regions and portions of the dielectric stack that extend beyond the diameters of the N+ and P+ epi material to leave sidewall structures around the N+ and P+ epi material. The sidewall structures include the dielectric-metal-dielectric stack. The uncovered regions of the dielectric stack are then etched to define NMOS and PMOS gate electrode regions that are self-aligned, thus forming dielectric stack/metal gate electrodes. The photomask is removed, and a new mask is formed (not shown) to cover the P+ epitaxial regions. Metal 2 409 is removed in the N+ gate electrode regions. Metal 1 408 is deposited in the openings formed by the removal of Metal 2 409. At this point, NMOS and PMOS gate electrodes have unique metal work functions. Similarly to the process described with respect to FIG. 3I, a photomask is formed to cover the P+ region and an N+ implant is executed to dope the P-type substrate with N-type dopant 404. Optionally, a silicide layer 426 may be deposited on the N-type dopant or instead of the N-type dopant, followed by a spike anneal to convert the silicide to salicide. Similarly to the process described with respect to FIG. 3J, the photomask is removed and the N+ region is covered with a new photomask. In an optional step, a P+ implant is executed to dope N-type region 403 with P-type dopant 405. A silicide layer 426 may be deposited on the P-type dopant or instead of the P-type dopant. Similarly to the processing step previously described with respect to FIG. 3K, the photomask is removed as well as high-K material 416 from the tops of the vertical channel structures. A silicide layer 426 is deposited on the tops of the channel regions formed by N+ epitaxial material 418 and P+ epitaxial material 419, followed by a spike anneal to convert the silicide to salicide.

Thus, FIG. 4D shows the basic cells for the PMOS and NMOS transistors before wiring.

Figure 4E:
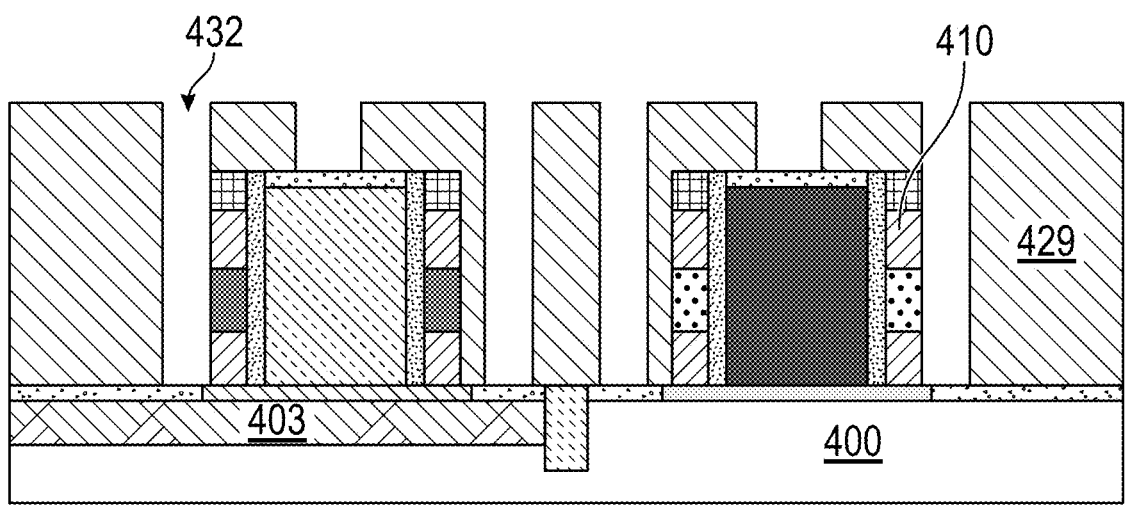
FIG. 4E shows a dielectric film formed over the substrate with etched via openings, according to aspects of the present disclosure.

FIG. 4E shows processing the PMOS and NMOS transistors to form Vg, Vdd and Vss contacts. The process steps are similar to those previously described with respect to FIGS. 3K and 3L. A dielectric film 429 is deposited and then planarized by etch back or CMP. The dielectric film 429 should be etch selective to the second dielectric 410. The substrate is then masked in a pattern to etch via openings 432 in the dielectric film 429 for metal contacts.

Figure 4F:
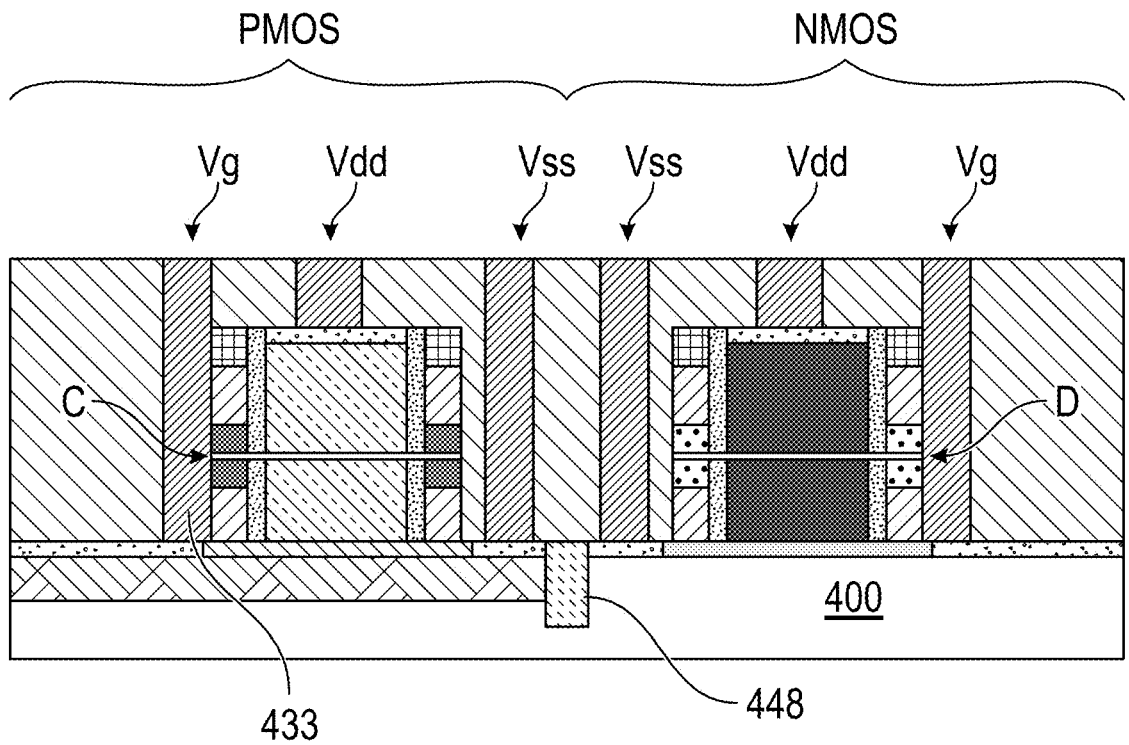
FIG. 4F shows the etched via openings of FIG. 4E filled with metal, according to aspects of the present disclosure.

FIG. 4F shows the PMOS and NMOS transistors with via metal 433 deposited in the openings 432 to form Vg, Vdd and Vss contacts. The dielectric diffusion break 448 electrically isolates the PMOS and NMOS transistors formed on the same substrate 400.

Figure 4G:
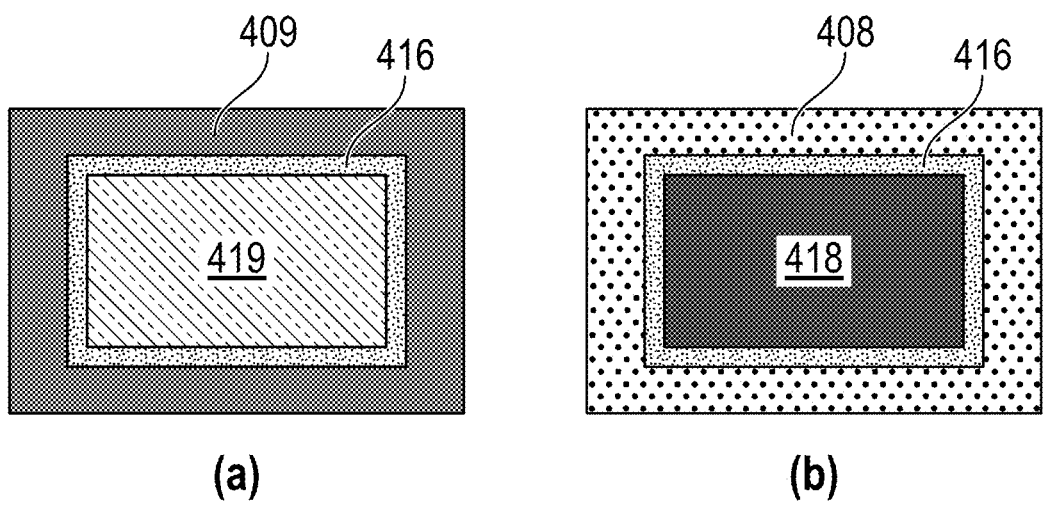
FIG. 4G shows a) a top cross-section of the PMOS device, and (b) a top cross-section of the NMOS device, according to aspects of the present disclosure.

FIG. 4G shows (a) a top cross section of the PMOS transistor taken at plane C (shown in FIG. 4F) and (b) a top cross section of the NMOS transistor taken at plane D (shown in FIG. 4F). The Vss source contacts and Vdd drain contacts are not shown in FIG. 4G. In FIG. 4G(a), the gate electrode (Vgate) connects to Metal 2 409, the channel is 419 and the gate dielectric 416. In FIG. 4G(b), gate electrode of Metal 1 408 is shown which connects to Vgate, and the N+ channel region 418 and the gate dielectric 416 are shown.

The cross-sectional device shape has been described as 3D rectangular, 3D circular and 3D cylindrical, but is not limited in shape and may have any shape as viewed from the top and sides.

Multiple work functions for either NMOS or PMOS can be obtained by repeating steps in FIG. 4A-4G. This allows for multiple Vt tuning by replacement of metal with new self-aligned metal as options. Accordingly, vertical-channel devices are created from a dielectric/metal layer stack. Gate connections can be made to the gate stack at any location around the vertical channel structure. S/D connection can be made at the top of the vertical channel and to underlying semiconductor material.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

Obviously, numerous modifications and variations of the present invention are possible in light of the above teachings. It is therefore to be understood that within the scope of the appended claims, the invention may be practiced otherwise than as specifically described herein.

The invention claimed is:

1. A method of microfabrication, the method comprising:
providing a substrate;
doping regions of the substrate by implanting a first dopant material;
forming a layer stack on the substrate, the layer stack having a metal layer of a first metal positioned between a first dielectric layer and a second dielectric layer and a first capping layer on the second dielectric layer;
forming openings through the layer stack until uncovering the substrate;
depositing a high-K material in the openings;
removing the high-K material from horizontal surfaces of the layer stack and the substrate leaving the high-K material on walls of the openings;
epitaxially growing vertical channel structures in the openings for channels of transistors having current flow perpendicular to a working surface of the substrate;
depositing a high-K material on an upper surface of the vertical channel structures;
masking the substrate and etching the layer stack leaving sidewall structures of the layer stack on the vertical channel structures, the metal layer of the sidewall structures forming a gate contact of a field effect transistor;
masking the layer stack and the sidewall structures;
doping the substrate between the sidewall structures by implanting a second dopant material into the substrate; and
planarizing the substrate to remove the high-K material from the upper surface of the vertical channel structures.

2. The method of claim 1, further comprising:
forming silicide on the first dopant material and the layer stack to provide salicide source/drain connections and a salicide layer on the layer stack.

3. The method of claim 2, further comprising:
depositing a dielectric film over the substrate;
masking the dielectric film;
etching via openings in uncovered portions of the dielectric film; and
forming gate, source and drain contacts by depositing metal contact material in the via openings.

4. The method of claim 3, wherein doping regions of the substrate by implanting a first dopant material comprises
implanting N+ material; and
forming the openings comprises exposing at least a portion of the N+ material.

5. The method of claim 4, wherein epitaxially growing the vertical channel structures comprises epitaxially growing N+ epitaxial material in the openings over the N+ material.

6. The method of claim 3, wherein doping regions of the substrate by implanting a first dopant material comprises
implanting P+ material; and
forming the openings comprises exposing at least a portion of the P+ material.

7. The method of claim 6, wherein epitaxially growing the vertical channel structures comprises epitaxially growing P+ epitaxial material in the openings over the P+ material.

8. The method of claim 3, wherein doping regions of the substrate by implanting a first dopant material comprises doping P+ regions of the substrate by implanting P+ material prior to forming the layer stack, the method further comprising:
stepwise masking the substrate;
doping N+ regions of the substrate by implanting N+ material; and
forming the openings over the P+ and N+ regions.

9. The method of claim 8, further comprising:
epitaxially growing P+ epitaxial material in the openings over the P+ regions; and
epitaxially growing N+ epitaxial material in the openings over the N+ regions.

10. The method of claim 8, further comprising:
replacing the first metal with a second metal in the sidewall structures surrounding the N+ epitaxial material.

11. The method of claim 10, wherein doping the substrate between the sidewall structures by implanting a second dopant material into the substrate comprises doping the substrate between the sidewall structures by implanting P+ dopant material between sidewall structures surrounding P+ epitaxial material, the method further comprising: doping the substrate between the sidewall structures by implanting N+ dopant material between sidewall structures surrounding N+ epitaxial material.

12. The method of claim 11, wherein masking the layer stack and the sidewall structures comprises masking the substrate with a pattern of photoresist which leaves uncovered regions between the sidewall structures surrounding the P+ epitaxial material and the sidewall structures surrounding the N+ epitaxial material prior to implanting P+ or N+ dopant material between the sidewall structures, the method further comprising: forming a diffusion break in the substrate by depositing a first dielectric oxide material in the uncovered regions between the sidewall structures surrounding the P+ epitaxial material and the sidewall structures surrounding the N+ epitaxial material.

* * * * *